(12) United States Patent
Lee et al.

(10) Patent No.: US 9,355,594 B2
(45) Date of Patent: May 31, 2016

(54) PIXEL AND ORGANIC LIGHT-EMITTING DIODE (OLED) DISPLAY

(71) Applicant: Samsung Display Co., Ltd., Yongin, Gyeonggi-do (KR)

(72) Inventors: Seung-Kyu Lee, Asan-si (KR); Chae-Han Hyun, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/606,809

(22) Filed: Jan. 27, 2015

(65) Prior Publication Data
US 2016/0055792 A1    Feb. 25, 2016

(30) Foreign Application Priority Data
Aug. 25, 2014   (KR) .......................... 10-2014-0110702

(51) Int. Cl.
*G09G 3/32*    (2016.01)

(52) U.S. Cl.
CPC ........ *G09G 3/325* (2013.01); *G09G 2300/0819* (2013.01); *G09G 2300/0876* (2013.01); *G09G 2310/0251* (2013.01); *G09G 2320/0252* (2013.01); *G09G 2320/041* (2013.01)

(58) Field of Classification Search
CPC .................................................. G09G 3/3233
USPC ............ 345/690, 204–207, 211–214, 76, 77, 345/80, 82, 92, 102, 90
See application file for complete search history.

(56) References Cited

U.S. PATENT DOCUMENTS

| 2007/0103056 A1 | 5/2007 | Cok |
| 2013/0002616 A1 | 1/2013 | Kim et al. |
| 2015/0371606 A1* | 12/2015 | Lee .......................... G09G 5/02 345/690 |

FOREIGN PATENT DOCUMENTS

| KR | 10-2012-0061146 (A) | 6/2012 |
| KR | 10-2013-0007065 (A) | 1/2013 |
| KR | 10-2013-0075429 (A) | 7/2013 |

* cited by examiner

*Primary Examiner* — Tuyet Vo
(74) *Attorney, Agent, or Firm* — Knobbe, Martens, Olson & Bear, LLP

(57) ABSTRACT

A pixel and organic light-emitting diode (OLED) display are disclosed. In one aspect, the pixel includes an organic light-emitting diode (OLED) configured to emit light based on a driving current. The OLED includes first and second electrodes. The pixel also includes a first transistor configured to generate the driving current. The first transistor includes a gate electrode, a first electrode, and a second electrode. The pixel further includes a capacitor transistor including a gate electrode configured to receive a gate turn-on voltage, a first electrode, a second electrode electrically connected to the first electrode of the first transistor. The capacitor transistor further includes a channel located between the first and second electrodes of the capacitor transistor. The channel of the capacitor transistor is configured to be activated by the gate turn-on voltage.

20 Claims, 10 Drawing Sheets

PIXEL AND ORGANIC LIGHT-EMITTING DIODE (OLED) DISPLAY

CROSS-REFERENCE TO RELATED APPLICATIONS

This application claims priority under 35 U.S.C. §119 to Korean patent Application No. 10-2014-0110702 filed on Aug. 25, 2014, the disclosure of which is hereby incorporated by reference herein in its entirety.

BACKGROUND

1. Field

The described technology generally relates to a pixel and an organic light-emitting diode (OLED) display having the pixel.

2. Description of the Related Technology

Displays include a plurality of pixels which emit light to form an image. The pixels of OLED displays each include an OLED. OLEDs emit the light having a wavelength that depends on the type of organic material included in the light-emitting layer of the OLED. For example, OLEDs can include different types of organic materials in order to emit one of a red, green and blue colored light. OLED displays mix light having different colors emitted by the OLEDs for form a color image.

SUMMARY OF CERTAIN INVENTIVE ASPECTS

One inventive aspect is a pixel having an OLED with an improved response speed.

Another aspect is an OLED display having an OLED with an improved response speed.

Another aspect is a pixel including an OLED configured to emit light based on a driving current, the OLED including a first electrode and a second electrode, a first transistor configured to generate the driving current, the first transistor including a gate electrode, a first electrode, and a second electrode, and a capacitor transistor including a gate electrode to which a gate turn-on voltage is applied, a first electrode, and a second electrode connected to the first electrode of the first transistor. The gate turn-on voltage may activate a channel located between the first electrode of the capacitor transistor and the second electrode of the capacitor transistor.

In example embodiments, the capacitor transistor may function as a capacitor using the activated channel as a first electrode and the gate electrode of the capacitor transistor as a second electrode.

In example embodiments, the pixel further includes a second transistor including a gate electrode to which a scan signal is applied, a first electrode to which a data signal is applied, and a second electrode connected to the first electrode of the capacitor transistor, a third transistor including a gate electrode to which the scan signal is applied, a first electrode connected to the second electrode of the first transistor, and a second electrode connected to the gate electrode of the first transistor, a storage capacitor including a first electrode to which a first power voltage is applied and a second electrode connected to the gate electrode of the first transistor, a fourth transistor including a gate electrode to which a data initialization signal is applied, a first electrode to which an initialization voltage is applied, and a second electrode connected to the gate electrode of the first transistor, a fifth transistor including a gate electrode to which an emission signal is applied, a first electrode to which the first power voltage is applied, and a second electrode connected to the first electrode of the first transistor, a sixth transistor including a gate electrode to which the emission signal is applied, a first electrode connected to the second electrode of the first transistor, and the second electrode connected the first electrode of the OLED, and a seventh transistor including a gate electrode to which a diode initialization signal is applied, a first electrode to which the initialization voltage is applied, and a second electrode connected to the first electrode of the OLED. A second power voltage may be applied to the second electrode of the OLED.

In example embodiments, the second transistor may apply the data signal to the first electrode of the capacitor transistor while the scan signal is active. The third transistor may connect the gate electrode of the first transistor to the second electrode of the first transistor while the scan signal is active. The storage capacitor may maintain a voltage level of the gate electrode of the first transistor while the scan signal is inactive. The fourth transistor may apply the initialization voltage to the gate electrode of the first transistor while the data initialization signal is active. The fifth transistor may apply the first power voltage to the first electrode of the first transistor while the emission signal is active. The sixth transistor may provide the driving current generated by the first transistor to the OLED while the emission signal is active. The seventh transistor may apply the initialization voltage to the first electrode of the OLED while the diode initialization signal is active. The OLED may emit the light while the emission signal is active.

In example embodiments, the data initialization signal and the diode initialization signal may be the same.

In example embodiments, the data initialization signal may be the same as the scan signal advanced by one pixel row or frame period.

In example embodiments, the pixel may further include a response speed improvement capacitor connected between the gate electrode of the first transistor and the first electrode of the first transistor.

In example embodiments, the pixel further includes a diode parallel capacitor connected between the first electrode of the OLED and the second electrode of the OLED.

Another aspect is an OLED display including a substrate, an active pattern formed on the substrate, the active pattern including a first region, a second region, a first capacitor region, and a second capacitor region, a gate insulation layer covering the active pattern, the gate insulation layer formed on the substrate, a first gate electrode formed on the gate insulation layer, the first gate electrode composing a first transistor with the first region and the second region, and a second gate electrode to which a gate turn-on voltage is applied, the second gate electrode formed on the gate insulation layer, the second gate electrode composing a capacitor transistor with the first capacitor region and the second capacitor region. The first transistor may generate a driving current provided to an OLED. The second capacitor region may be connected to the first region. The gate turn-on voltage may activate a channel that is a portion of the active pattern located below the second gate electrode.

In example embodiments, the capacitor transistor may perform a role as a capacitor using the activated channel as a first electrode and the gate electrode of the capacitor transistor as a second electrode.

In example embodiments, the active pattern may further include third through fourteenth regions.

In example embodiments, the OLED display may further include a third gate electrode formed on the gate insulation layer, the third gate electrode forming a second transistor with the third region and the fourth region, the third gate electrode forming a third transistor with the fifth region and the sixth region, a fourth gate electrode formed on the gate insulation layer, the fourth gate electrode forming a fourth transistor with the seventh region and the eighth region, a fifth gate electrode formed on the gate insulation layer, the fifth gate electrode forming a fifth transistor with the ninth region and the tenth region, the fifth gate electrode forming a six transistor with the eleventh region and the twelfth region, and a sixth gate electrode formed on the gate insulation layer, the sixth gate electrode forming a seventh transistor with the thirteenth region and the fourteenth region.

In example embodiments, the fourth region may be connected to the first capacitor region. The fifth region may be connected to the second region. The eighth region may be connected to the sixth region. The tenth region may be connected to the first region. The eleventh region may be connected to the second region. The fourth region may be connected to the twelfth region.

In example embodiments, the third gate electrode may receive a scan signal. The fourth gate electrode may receive a data initialization signal. The fifth gate electrode may receive an emission signal. The sixth gate electrode may receive a diode initialization signal. The seventh region and the thirteenth region may receive an initialization voltage.

In example embodiments, the OLED display may further include a first insulation interlayer covering the first through sixth gate electrodes, the first insulation interlayer formed on the gate insulation layer, a data pattern formed on the first insulation interlayer, the data pattern contacting the third region, a power pattern formed on the first insulation interlayer, the power pattern forming a storage capacitor with the first gate electrode, the power pattern contacting the ninth region, a first connection pattern formed on the first insulation interlayer, the first connection pattern contacting the first gate electrode and the eighth region, and a second connection pattern formed on the first insulation interlayer, the second connection pattern contacting the twelfth region.

In example embodiments, the data pattern may receive a data signal. The power pattern may receive a first power voltage.

In example embodiments, the OLED display may further include a second insulation interlayer covering the data pattern, the power pattern, the first connection pattern, and the second connection pattern, the second insulation interlayer formed on the first insulation interlayer, and a first electrode formed on the second insulation interlayer, the first electrode contacting the second connection pattern.

In example embodiments, the OLED display may further include a pixel defining layer formed on the second insulation interlayer, an organic light-emitting layer formed on the first electrode, and a second electrode formed on the second insulation interlayer and the organic light-emitting layer.

In example embodiments, the second electrode may receive a second power voltage.

In example embodiments, the first electrode may compose the OLED with the organic light-emitting layer and the second electrode.

Another aspect is a pixel comprising an organic light-emitting diode (OLED) configured to emit light based on a driving current, wherein the OLED includes a first electrode and a second electrode; a first transistor configured to generate the driving current, wherein the first transistor includes a gate electrode, a first electrode, and a second electrode; and a capacitor transistor including i) a gate electrode configured to receive a gate turn-on voltage, ii) a first electrode, iii) a second electrode electrically connected to the first electrode of the first transistor, wherein the capacitor transistor further includes a channel located between the first electrode of the capacitor transistor and the second electrode of the capacitor transistor, and wherein the channel of the capacitor transistor is configured to be activated by the gate turn-on voltage.

In example embodiments, the capacitor transistor is further configured to act as a capacitor when activated, wherein the activated channel is configured to act as a first electrode of the capacitor and wherein the gate electrode of the capacitor transistor is configured to act as a second electrode of the capacitor.

In example embodiments, the pixel further comprises a second transistor including i) a gate electrode configured to receive a scan signal, ii) a first electrode configured to receive a data signal, and a second electrode electrically connected to the first electrode of the capacitor transistor; a third transistor including i) a gate electrode configured to receive the scan signal, ii) a first electrode electrically connected to the second electrode of the first transistor, and iii) a second electrode electrically connected to the gate electrode of the first transistor; a storage capacitor including i) a first electrode configured to receive a first power voltage and ii) a second electrode electrically connected to the gate electrode of the first transistor; a fourth transistor including i) a gate electrode configured to receive a data initialization signal, ii) a first electrode configured to receive an initialization voltage, and iii) a second electrode electrically connected to the gate electrode of the first transistor; a fifth transistor including i) a gate electrode configured to receive an emission signal, ii) a first electrode configured to receive the first power voltage, and iii) a second electrode electrically connected to the first electrode of the first transistor; a sixth transistor including i) a gate electrode configured to receive the emission signal, ii) a first electrode electrically connected to the second electrode of the first transistor, and iii) a second electrode electrically connected the first electrode of the OLED; and a seventh transistor including i) a gate electrode configured to receive a diode initialization signal, ii) a first electrode configured to receive the initialization voltage, and ii) a second electrode electrically connected to the first electrode of the OLED, wherein the second electrode of the OLED is configured to receive a second power voltage.

In example embodiments, the data initialization signal and the diode initialization signal are the same. The data initialization signal can be the same as a scan signal applied to an adjacent pixel in a previous pixel row. The pixel can further comprise a response speed improvement capacitor electrically connected between the gate electrode of the first transistor and the first electrode of the first transistor. The pixel can further comprise a diode parallel capacitor electrically connected between the first electrode of the OLED and the second electrode of the OLED.

Another aspect is an OLED display comprising a substrate; an active pattern formed on the substrate, wherein the active pattern includes a first region, a second region, a first capacitor region, a second capacitor region, and a channel region located between the first and second capacitor regions; a gate insulation layer covering the active pattern, wherein the gate insulation layer is formed on the substrate; a first gate electrode formed on the gate insulation layer, wherein the first gate electrode, the first region, and the second region form a first transistor; a second gate electrode configured to receive a gate turn-on voltage, wherein the second gate electrode is formed on the gate insulation layer and wherein the second gate electrode, the first capacitor region, the second capacitor region, and the channel region form a capacitor transistor; and an OLED formed on the substrate, wherein the first transistor is configured to i) generate a driving current and ii) provide the driving current to the OLED, wherein the second capacitor region is electrically connected to the first region, and wherein the channel is configured to be activated by the gate turn-on voltage.

In example embodiments, the capacitor transistor is further configured to act as a capacitor when activated, wherein the activated channel is configured to act as a first electrode and wherein the gate electrode of the capacitor transistor is configured to act as a second electrode of the capacitor. The active pattern can further include third through fourteenth regions.

In example embodiments, the display device further comprises a third gate electrode formed on the gate insulation layer, wherein the third gate electrode, the third region, and the fourth region form a second transistor and wherein the third gate electrode, the fifth region, and the sixth region form a third transistor; a fourth gate electrode formed on the gate insulation layer, wherein the fourth gate electrode, the seventh region, and the eighth region form a fourth transistor; a fifth gate electrode formed on the gate insulation layer, wherein the fifth gate electrode, the ninth region, and the tenth region form a fifth transistor and wherein the fifth gate electrode, the eleventh region, and the twelfth region form a sixth transistor; and a sixth gate electrode formed on the gate insulation layer, wherein the sixth gate electrode, the thirteenth region, and the fourteenth region form a seventh transistor.

In example embodiments, the fourth region is electrically connected to the first capacitor region, the fifth region is electrically connected to the second region, the eighth region is electrically connected to the sixth region, the tenth region is electrically connected to the first region, the eleventh region is electrically connected to the second region, and the fourteenth region is electrically connected to the twelfth region.

In example embodiments, the third gate electrode is configured to receive a scan signal, the fourth gate electrode is configured to receive a data initialization signal, the fifth gate electrode is configured to receive an emission signal, the sixth gate electrode is configured to receive a diode initialization signal, and the seventh region and the thirteenth region are configured to receive an initialization voltage.

In example embodiments, the display further comprises a first insulation interlayer covering the first through sixth gate electrodes, wherein the first insulation interlayer is formed on the gate insulation layer; a data pattern formed on the first insulation interlayer, wherein the data pattern contacts the third region; a power pattern formed on the first insulation interlayer, wherein the power pattern and the first gate electrode form a storage capacitor and wherein the power pattern contacts the ninth region; a first connection pattern formed on the first insulation interlayer, wherein the first connection pattern contacts the first gate electrode and the eighth region; and a second connection pattern formed on the first insulation interlayer, wherein the second connection pattern contacts the twelfth region.

In example embodiments, the data pattern is configured to receive a data signal and wherein the power pattern is configured to receive a first power voltage. The display can further comprise a second insulation interlayer covering the data pattern, the power pattern, the first connection pattern, and the second connection pattern, wherein the second insulation interlayer is formed on the first insulation interlayer; and a first electrode formed on the second insulation interlayer, wherein the first electrode contacts the second connection pattern.

In example embodiments, the display further comprises a pixel defining layer formed on the second insulation interlayer; an organic light-emitting layer formed on the first electrode; and a second electrode formed on the second insulation interlayer and the organic light-emitting layer. The second electrode can be configured to receive a second power voltage. The first electrode, the organic light-emitting layer, and the second electrode can form the OLED.

According to at least one embodiment, a pixel includes a capacitor transistor performing a role as a capacitor and a first transistor generating a driving current. A source electrode of the first transistor is connected to the capacitor transistor, thereby increasing a response speed of an OLED.

In addition, an OLED display including the pixel can be manufactured without additional process for forming additional capacitor, thereby reducing the manufacturing cost.

BRIEF DESCRIPTION OF THE DRAWINGS

Exemplary embodiments will be described more fully hereinafter with reference to the accompanying drawings, in which various embodiments are shown.

DETAILED DESCRIPTION OF CERTAIN INVENTIVE EMBODIMENTS

OLEDs emit light in response to an applied driving current. The driving current is generated by a driving transistor. It takes a minimum amount of time in order for the driving current to reach a target level. Thus, there is a delay between when the driving transistor initiates generation of the driving current until the target level is reached. Therefore, a time period is required before the luminance of the light emitted by the OLEDs reaches a target luminance. Thus, the response speed of OLEDs can be improved by reducing the delay in reaching the target current level.

Exemplary embodiments will be described more fully hereinafter with reference to the accompanying drawings, in which various embodiments are shown.

Figure 1:
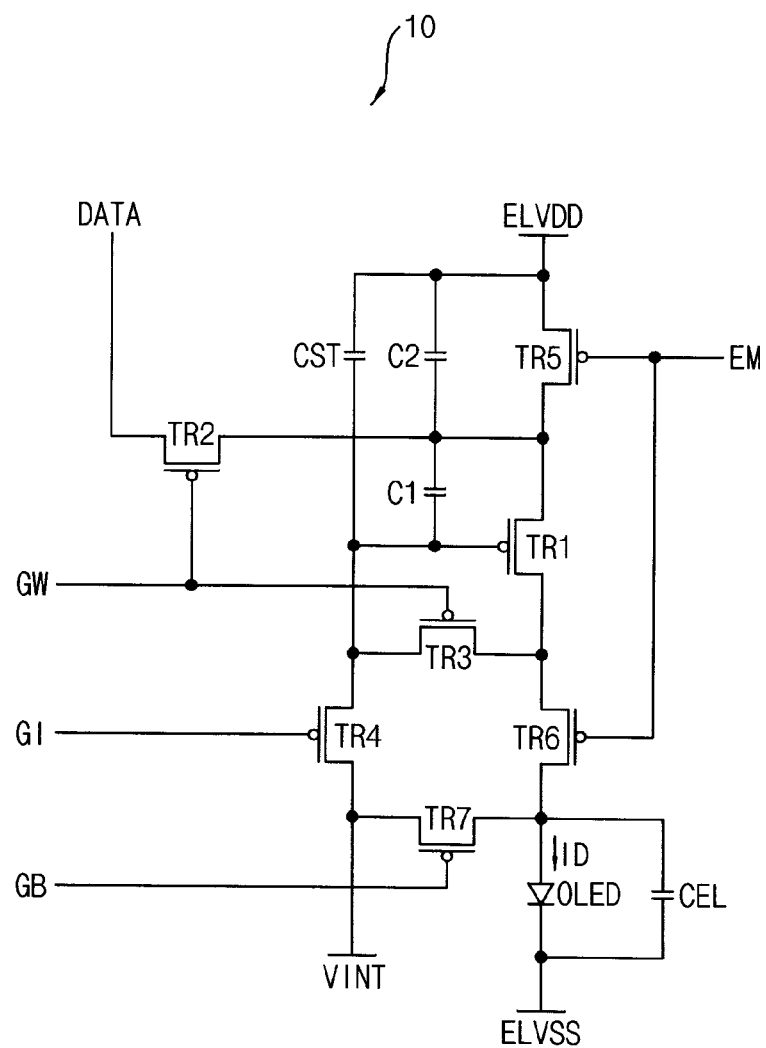
FIG. 1 is a circuit diagram illustrating an example of a pixel for increasing the response speed of an OLED according to an embodiment.

FIG. 1 is a circuit diagram illustrating an example of a pixel having an increased OLED response speed.

Referring to FIG. 1, the pixel 10 includes an OLED, a first transistor TR1, a second transistor TR2, a third transistor TR3, a storage capacitor CST, a fourth transistor TR4, a fifth transistor TR5, a sixth transistor TR6, and a seventh transistor TR7. In one example embodiment, the pixel 10 further includes a response speed improvement capacitor C1, a source connection capacitor C2, and a diode parallel capacitor CEL. The response speed improvement capacitor C1 and the diode parallel capacitor CEL may be parasitic capacitors.

The OLED emits light based on a driving current ID. The OLED includes a first electrode and a second electrode. In one example embodiment, a second power voltage ELVSS is applied to the second electrode of the OLED. In one example embodiment, the first electrode of the OLED is an anode electrode and the second electrode of the OLED is a cathode electrode. In another example embodiment, the first electrode of the OLED is the cathode electrode and the second electrode of the OLED is the anode electrode.

The first transistor TR1 includes a gate electrode, a first electrode, and a second electrode. In one example embodiment, the first electrode of the first transistor TR1 is a source electrode and the second electrode of the first transistor TR1 is a drain electrode. In another example embodiment, the first electrode of the first transistor TR1 is a drain electrode and the second electrode of the first transistor TR1 is a source electrode.

The first transistor TR1 generates the driving current ID. In one example embodiment, the first transistor TR1 operates in a saturation region. In this embodiment, the first transistor TR1 generates the driving current ID based on a voltage difference between the gate electrode and the source electrode of the first transistor TR1. A grayscale is reflected by the luminance of light emitted by the OLED based on the driving current ID provided to the OLED. In another example embodiment, the first transistor TR1 operates in a linear region. In this embodiment, the grayscale is reflected based on the length of a time period in which the driving current ID is provided to the OLED.

The second transistor TR2 includes a gate electrode, a first electrode and a second electrode. A scan signal GW is applied to the gate electrode. A data signal DATA is applied to the first electrode. The second electrode is connected to the first electrode of the first transistor TR1. In one example embodiment, the first electrode of the second transistor TR2 is a source electrode and the second electrode of the second transistor TR2 is a drain electrode. In another example embodiment, the first electrode of the second transistor TR2 is a drain electrode and the second electrode of the second transistor TR2 is a source electrode.

The second transistor TR2 provides the data signal DATA to the first electrode of the first transistor TR1 while the scan signal GW is active. The second transistor TR2 may operate in a linear region.

The third transistor TR3 includes a gate electrode, a first electrode and a second electrode. The scan signal GW is applied to the gate electrode. The first electrode is connected to the second electrode of the first transistor TR1. The second electrode is connected to the gate electrode of the first transistor TR1. In one example embodiment, the first electrode of the third transistor TR3 is a source electrode and the second electrode of the third transistor TR3 is a drain electrode. In another example embodiment, the first electrode of the third transistor TR3 is a drain electrode and the second electrode of the third transistor TR3 is a source electrode.

The third transistor TR3 connects the gate electrode of the first transistor TR1 to the second electrode of the first transistor TR1 while the scan signal GW is active. The third transistor TR3 may operate in a linear region. Thus, in this embodiment, the third transistor TR3 forms a diode connection of the first transistor TR1 while the scan signal GW is active. The voltage difference between the first electrode of the first transistor TR1 and the gate electrode of the first transistor TR1, which amount corresponds to a threshold voltage of the first transistor TR1, is generated due to the diode connection. As a result, a sum of the data signal DATA provided to the first electrode of the first transistor TR1 and the voltage difference (i.e., the threshold voltage) is applied to the gate electrode of the first transistor TR1 while the scan signal GW is active. Thus, the data signal DATA is compensated by the threshold voltage of the first transistor TR1. The compensated data signal DATA is applied to the gate electrode of the first transistor TR1. Accordingly, the uniformity of the driving current ID can be improved by reducing the effect of the threshold voltage of the first transistor TR1.

The storage capacitor CST includes a first electrode to which a first power voltage ELVDD is applied and a second electrode connected to the gate electrode of the first transistor TR1. The storage capacitor CST maintains the voltage level of the gate electrode of the first transistor TR1 while the scan signal GW is inactive. An emission signal EM may be active while the scan signal GW is inactive. The driving current ID generated by the first transistor TR1 may be provided to the OLED while the emission signal EM is active. Therefore, the driving current ID generated by the first transistor TR1 may be provided to the OLED based on the voltage level maintained by the storage capacitor CST.

The fourth transistor TR4 includes a gate electrode, a first electrode and a second electrode. A data initialization signal GI is applied to the gate electrode. An initialization voltage VINT is applied to the first electrode. The second electrode is connected to the gate electrode of the first transistor TR1. In one example embodiment, the first electrode of the fourth transistor TR4 is a source electrode and the second electrode of the fourth transistor TR4 is a drain electrode. In another example embodiment, the first electrode of the fourth transistor TR4 is a drain electrode and the second electrode of the fourth transistor TR4 is a source electrode.

The fourth transistor TR4 applies the initialization voltage VINT to the gate electrode of the first transistor TR1 while the data initialization signal GI is active. The fourth transistor TR4 may operate in a linear region. Thus, the fourth transistor TR4 initializes the gate electrode of the first transistor TR1 to the initialization voltage VINT while the data initialization signal GI is active. In one example embodiment, the voltage level of the initialization voltage VINT is less than the voltage level of the data signal DATA maintained by the storage capacitor CST in a previous frame. The initialization voltage VINT is applied to the gate electrode of the first transistor TR1. In this embodiment, the first transistor TR1 is a p-channel metal oxide semiconductor (PMOS)-type transistor. In another example embodiment, the voltage level of the initialization voltage VINT is greater than the voltage level of the data signal DATA maintained by the storage capacitor CST in a previous frame. The initialization voltage VINT is applied to the gate electrode of the first transistor TR1. In this embodiment, the first transistor TR1 is an n-channel metal oxide semiconductor (NMOS)-type transistor.

In one example embodiment, the data initialization signal GI is identical to the scan signal GW advanced by one horizontal time. For example, the data initialization signal GI is applied to pixels located in the (n)th row and the data initialization signal GI is substantially the same as the scan signal GW applied to pixels located in the (n−1)th row. Thus, the data initialization signal GI that is active is applied to pixels located in the (n)th row by applying the scan signal GW that is active to pixels located in the (n−1)th row. As a result, the gate electrode of the first transistor TR1 included in pixels located in the (n)th row is initialized as the initialization voltage VINT when the data signal DATA is applied pixels located in the (n−1)th row.

The fifth transistor TR5 includes a gate electrode, a first electrode and a second electrode. The emission signal EM is applied to the gate electrode. The first power voltage ELVDD is applied the first electrode. The second electrode is connected to the first electrode of the first transistor TR1. In one example embodiment, the first electrode of the fifth transistor TR5 is a source electrode and the second electrode of fifth transistor TR5 is a drain electrode. In another example embodiment, the first electrode of the fifth transistor TR5 is a drain electrode and the second electrode of the fifth transistor TR5 is a source electrode.

The fifth transistor TR5 applies the first power voltage ELVDD to the first electrode of the first transistor TR1 while the emission signal EM is active. The fifth transistor TR5 does not apply the first power voltage ELVDD while the emission signal EM is inactive. The fifth transistor TR5 may operate in a linear region. The fifth transistor TR5 applies the first power voltage ELVDD to the first electrode of the first transistor TR1 while the emission signal EM is active such that the first transistor TR1 generates the driving current ID. In addition, the fifth transistor TR5 does not apply the first power voltage ELVDD while the emission signal EM is inactive such that the data signal DATA applied to the first electrode of the first transistor TR1 is applied to the gate electrode of the first transistor TR1.

The sixth transistor TR6 includes a gate electrode, a first electrode and a second electrode. The emission signal EM is applied to the gate electrode. The first electrode is connected to the second electrode of the first transistor TR1. The second electrode is connected to the first electrode of the OLED. In one example embodiment, the first electrode of the sixth transistor TR6 is a source electrode and the second electrode of sixth transistor TR6 is a drain electrode. In another example embodiment, the first electrode of the sixth transistor TR6 is a drain electrode and the second electrode of the sixth transistor TR6 is a source electrode.

The sixth transistor TR6 provides the driving current ID generated by the first transistor TR1 to the OLED while the emission signal EM is active. The sixth transistor TR6 may operate in a linear region. Thus, the sixth transistor TR6 provides the driving current ID generated by the first transistor TR1 to the OLED while the emission signal EM is active such that the OLED emits light. In addition, the sixth transistor TR6 disconnects the first transistor TR1 from the OLED while the emission signal EM is inactive such that the compensated data signal DATA applied to the second electrode of the first transistor TR1 is applied to the gate electrode of the first transistor TR1.

The seventh transistor TR7 includes a gate electrode, a first electrode and a second electrode. A diode initialization signal GB is applied to the gate electrode. The initialization voltage VINT is applied to the first electrode. The second electrode is connected to the first electrode of the OLED. In one example embodiment, the first electrode of the seventh transistor TR7 is a source electrode and the second electrode of seventh transistor TR7 is a drain electrode. In another example embodiment, the first electrode of the seventh transistor TR7 is a drain electrode and the second electrode of the seventh transistor TR7 is a source electrode.

The seventh transistor TR7 applies the initialization voltage VINT to the first electrode of the OLED while the diode initialization signal GB is active. The seventh transistor TR7 operates in the linear region. Thus, the seventh transistor TR7 initializes the first electrode of the OLED to the initialization voltage VINT while the diode initialization signal GB is active. The initial change in charge of the diode parallel capacitor CEL can be calculated according to Equation 1 below:

$$Qi = CEL \times (VINT - ELVSS) \quad \text{Equation 1}$$

wherein, Qi is the initial change in charge of the diode parallel capacitor, CEL is the capacitance of the diode parallel capacitor, VINT is the voltage level of the initialization voltage, and ELVDD is the voltage level of the second power voltage.

In one example embodiment, the data initialization signal GI and the diode initialization signal GB are the same signal. An initialization operation of the gate electrode of the first transistor TR1 does not affect an initialization operation of the first electrode of the OLED. Therefore, the data initialization signal GI is used as the diode initialization signal GB, thereby improving the manufacturing efficiency.

The voltage difference between both electrodes of the OLED may be less than a threshold voltage of the OLED when the OLED does not emit light. The OLED emits light when the voltage difference is greater than the threshold voltage. Therefore, the voltage difference may reach the threshold voltage and light may be emitted when a threshold charge is stored in the diode parallel capacitor CEL. The threshold charge may be calculated according to Equation 2 below:

$$Qc = CEL \times Vth \quad \text{Equation 2}$$

wherein, Qc is the threshold charge, CEL is the capacitance of the diode parallel capacitor, Vth is the threshold voltage of the OLED.

In one example embodiment, the driving current ID is not zero due to a leakage current generated from the first transistor TR1 when the OLED is representing a black grayscale (i.e., the grayscale is zero). However the leakage current can flow through the diode parallel capacitor CEL instead of the OLED until the voltage difference between both electrodes of the OLED reaches the threshold voltage. The OLED does not emit the light while the diode parallel capacitor CEL is charged by the leakage current until it reaches the threshold charge. For example, if the leakage current is fixed, the initialization voltage VINT can be calculated according to Equation 3 below:

$$VINT \leq ELVSS + Vth - \frac{I_{leak} \times t}{CEL} \quad \text{Equation 3}$$

wherein, VIN is the voltage level of the initialization voltage, ELVSS is the voltage level of the second power voltage, Vth is the threshold voltage of the OLED, Beak is the leakage current, t is the time period over which the OLED will not to emit the light in one frame, and CEL is the capacitance of the diode parallel capacitor.

The response speed improvement capacitor C1 is connected between the gate electrode of the first transistor TR1 and the first electrode of the first transistor TR1. The voltage difference between the gate electrode and the source electrode (i.e., the first electrode) of the first transistor TR1 may be increased by the response speed improvement capacitor C1, thereby reducing the delay for generating the driving current ID by the first transistor TR1 when the emission signal EM is active. As a result, the response speed of the OLED is increased. In other words, the response speed of the OLED is increased when the voltage difference between the gate electrode and the source electrode of the first transistor TR1 is increased while the data initialization signal GI is active. In one example embodiment, the voltage level of the gate electrode of the first transistor TR1 that is a PMOS-type transistor is substantially the same as a voltage level of the initialization voltage VINT while the data initialization signal GI is active. The response speed of the OLED is increased when the voltage level of the first electrode of the first transistor TR1 is greater than the voltage level of the gate electrode of the first transistor TR1 while the data initialization signal GI is active. In another example embodiment, the first transistor TR1 is an NMOS-type transistor and the response speed of the OLED is increased when the voltage level of the first electrode of the first transistor TR1 is less than the voltage level of the gate electrode of the first transistor TR1 while the data initialization signal GI is active.

The source connection capacitor C2 includes a first electrode to which the first power voltage ELVDD is applied and a second electrode connected to the first electrode of the first transistor TR1. The source connection capacitor C2 maintains a voltage level of the first electrode of the first transistor TR1 while the data initialization signal GI is active.

The voltage level of the first electrode of the first transistor TR1 may be floated while the data initialization signal GI is active because the scan signal GW is inactive while the data initialization signal GI is active. Thus, the voltage level of the first electrode of the first transistor TR1 can be affected by voltage level changes of peripheral electrodes. The source connection capacitor C2 reduces the voltage level change of the first electrode of the first transistor TR1 due to voltage level changes of peripheral electrodes. Therefore, although the initialization voltage VINT is applied to the first electrode of the first transistor TR1, the voltage level of the first electrode of the first transistor TR1 can be prevented from being changed. As a result, the voltage difference between the gate electrode and the first electrode of the first transistor TR1 is increased.

Therefore, the source connection capacitor C2 increases the voltage difference between the gate electrode and the first electrode of the first transistor TR1 while the data initialization signal GI is active, thereby increasing the response speed of the OLED. However, the manufacture the source connection capacitor C2 includes additional processing such as mask processing. Hereinafter, the additional processing for the manufacturing the source connection capacitor C2 will be described in detail with reference to FIGS. 4 through 6.

Figure 2:
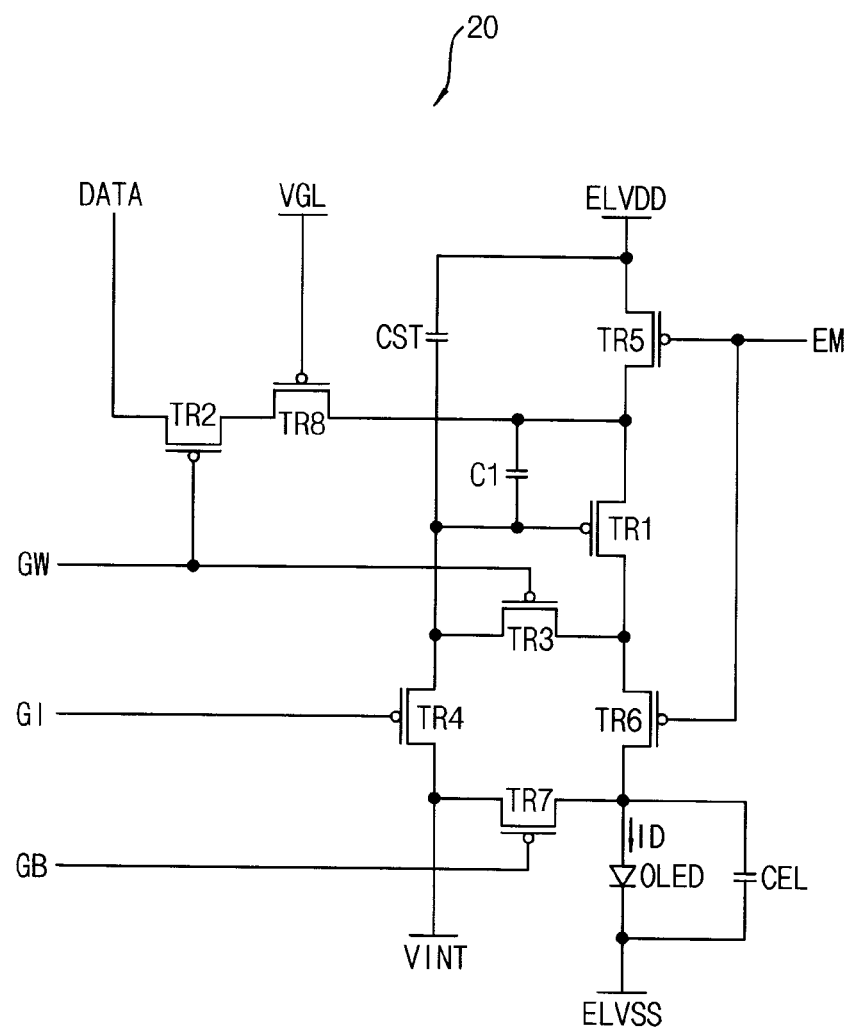
FIG. 2 is a circuit diagram illustrating a pixel according to example embodiments.
Figure 3:
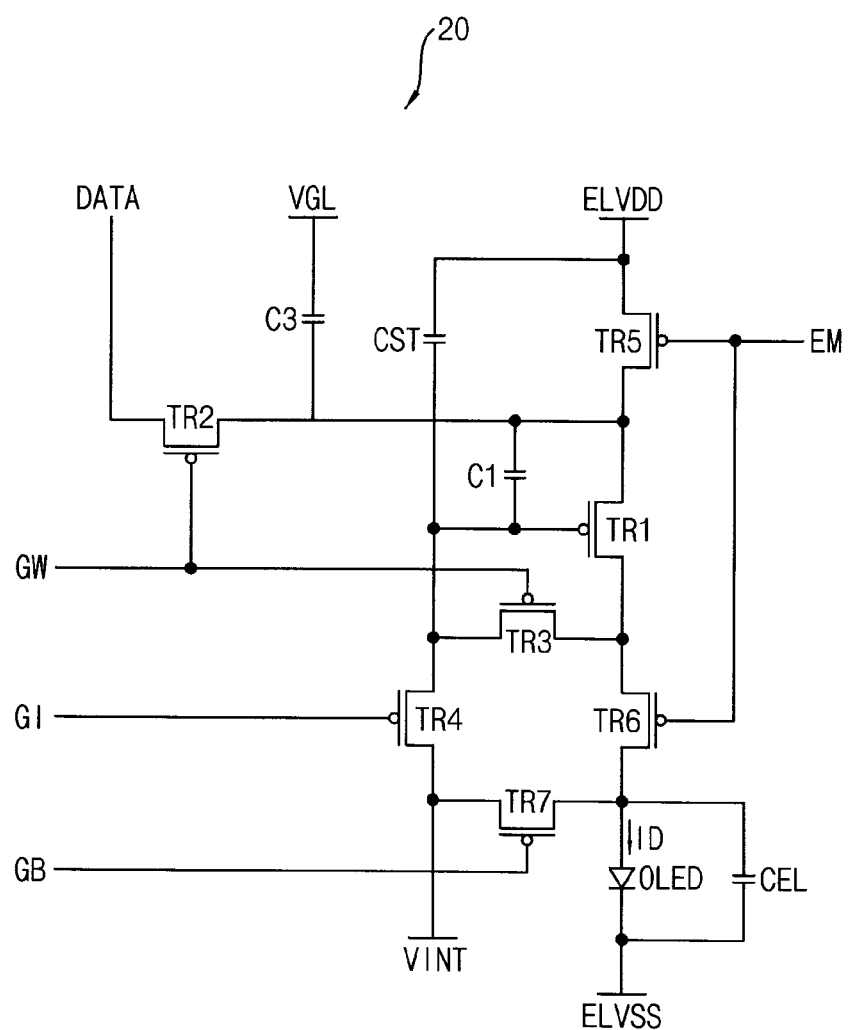
FIG. 3 is a circuit diagram illustrating the operation of the pixel of FIG. 2.

FIG. 2 is a circuit diagram illustrating a pixel according to example embodiments. FIG. 3 is a circuit diagram illustrating the operation of the pixel of FIG. 2.

Referring to FIG. 2, the pixel 20 includes an OLED, a first transistor TR1, a second transistor TR2, a third transistor TR3, a storage capacitor CST, a fourth transistor TR4, a fifth transistor TR5, a sixth transistor TR6, a seventh transistor TR7, and a capacitor transistor TR8. In one example embodiment, the pixel 20 further includes a response speed improvement capacitor C1 and a diode parallel capacitor CEL. The response speed improvement capacitor C1 and the diode parallel capacitor CEL may be parasitic capacitors.

Referring to FIG. 3, the capacitor transistor TR8 of FIG. 2 functions as a capacitor C3 having a first electrode connected to the first electrode of the first transistor TR1 and a second electrode connected to a terminal to which a gate turn-on voltage VGL is applied.

The OLED emit light based on a driving current ID. The OLED includes a first electrode and a second electrode. In one example embodiment, a second power voltage ELVSS is applied to the second electrode of the OLED. In one example embodiment, the first electrode of the OLED is an anode electrode and the second electrode of the OLED is a cathode electrode. In another example embodiment, the first electrode of the OLED is the cathode electrode and the second electrode of the OLED is the anode electrode.

The first transistor TR1 includes a gate electrode, a first electrode, and a second electrode. In one example embodiment, the first electrode of the first transistor TR1 is a source electrode and the second electrode of the first transistor TR1 is a drain electrode. In another example embodiment, the first electrode of the first transistor TR1 is a drain electrode and the second electrode of the first transistor TR1 is a source electrode.

The first transistor TR1 generates the driving current ID. In one example embodiment, the first transistor TR1 operates in a saturation region. In this embodiment, the first transistor TR1 generates the driving current ID based on a voltage difference between the gate electrode and the source electrode of the first transistor TR1. The grayscale is reflected by the luminance of the light emitted by the OLED based on the driving current ID provided to the OLED. In another example embodiment, the first transistor TR1 operates in a linear region. In this embodiment, the grayscale is reflected based on the length of a time period in which the driving current ID is provided to the OLED.

The capacitor transistor TR8 includes a gate electrode, a first electrode, and a second electrode. The gate turn-on voltage VGL is applied to the gate electrode. The second electrode is connected to the first electrode of the first transistor TR1. In one example embodiment, the first electrode of the capacitor transistor TR8 is a source electrode and the second electrode of capacitor transistor TR8 is a drain electrode. In another example embodiment, the first electrode of capacitor transistor TR8 is a drain electrode and the second electrode of capacitor transistor TR8 is a source electrode.

The gate turn-on voltage VGL activates the channel located between the first electrode of the capacitor transistor TR8 and the second electrode of the capacitor transistor TR8. In one example embodiment, the gate turn-on voltage VGL has a low voltage level to activate the channel of the capacitor transistor TR8. This embodiment, the capacitor transistor TR8 is a PMOS-type transistor. In another example embodiment, the gate turn-on voltage VGL has a high voltage level to activate the channel of the capacitor transistor TR8. In this embodiment, the capacitor transistor TR8 is an NMOS-type transistor.

The capacitor transistor TR8 functions as a capacitor C3 using the activated channel as a first electrode and the gate electrode of the capacitor transistor TR8 as a second electrode. The capacitor transistor TR8 maintains a voltage level of the first electrode of the first transistor TR1 while a data initialization signal GI is active.

The voltage level of the first electrode of the first transistor TR1 may be floated while the data initialization signal GI is active because the scan signal GW is inactive while the data initialization signal GI is active. Thus, the voltage level of the first electrode of the first transistor TR1 can be affected by voltage level changes of peripheral electrodes. The capacitor transistor TR8 decreases the voltage level change of the first electrode of the first transistor TR1 due to the voltage level changes of peripheral electrodes. Therefore, the voltage level of the first electrode of the first transistor T1 can be prevented from being changed regardless of whether the initialization voltage VINT is provided to the gate electrode of the first transistor TR1. As a result, the voltage difference between the gate electrode and the source electrode of the first transistor TR1 is increased.

The second transistor TR2 includes a gate electrode, a first electrode and a second electrode. A scan signal GW is applied to the gate electrode. A data signal DATA is applied to the first electrode. The second electrode is connected to the first electrode of the first transistor TR1. In one example embodiment, the first electrode of the second transistor TR2 is a source electrode and the second electrode of the second transistor TR2 is a drain electrode. In another example embodiment, the first electrode of the second transistor TR2 is a drain electrode and the second electrode of the second transistor TR2 is a source electrode.

The second transistor TR2 provides the data signal DATA to the first electrode of the capacitor transistor TR8 while the scan signal GW is active. The second transistor TR2 may operate in a linear region. In addition, the data signal DATA provided to the first electrode of the capacitor transistor TR8 is applied to the first electrode of the first transistor TR1 because the capacitor transistor TR8 is activated by the gate turn-on voltage VGL.

The third transistor TR3 includes a gate electrode, a first electrode and a second electrode. The scan signal GW is applied to the gate electrode. The first electrode is connected to the second electrode of the first transistor TR1. The second electrode is connected to the gate electrode of the first transistor TR1. In one example embodiment, the first electrode of the third transistor TR3 is a source electrode and the second electrode of the third transistor TR3 is a drain electrode. In another example embodiment, the first electrode of the third transistor TR3 is a drain electrode and the second electrode of the third transistor TR3 is a source electrode.

The third transistor TR3 connects the gate electrode of the first transistor TR1 to the second electrode of the first transistor TR1 while the scan signal GW is active. The third transistor TR3 may operate in a linear region. Thus, the third transistor TR3 forms a diode connection of the first transistor TR1 while the scan signal GW is active. The voltage difference between the first electrode of the first transistor TR1 and the gate electrode of the first transistor TR1 corresponds to a threshold voltage of the first transistor TR1 and is generated due to the diode connection. As a result, a sum of the data signal DATA provided to the first electrode of the first transistor TR1 and the voltage difference (i.e., the threshold voltage) is applied to the gate electrode of the first transistor TR1 while the scan signal GW is active. Thus, the data signal DATA is compensated by the threshold voltage of the first transistor TR1. The compensated data signal DATA is applied to the gate electrode of the first transistor TR1. the uniformity of the driving current ID can be improved by reducing the effect of the threshold voltage of the first transistor TR1.

The storage capacitor CST includes a first electrode to which a first power voltage ELVDD is applied and a second electrode connected to the gate electrode of the first transistor TR1. The storage capacitor CST maintains a voltage level of the gate electrode of the first transistor TR1 while the scan signal GW is inactive. An emission signal EM is active while the scan signal GW is inactive. The driving current ID generated by the first transistor TR1 is provided to the OLED while the emission signal EM is active. Therefore, the driving current ID generated by the first transistor TR1 is provided to the OLED based on the voltage level maintained by the storage capacitor CST.

The fourth transistor TR4 includes a gate electrode, a first electrode and a second electrode. A data initialization signal GI is applied to the gate electrode. An initialization voltage VINT is applied to the first electrode. The second electrode is connected to the gate electrode of the first transistor TR1. In one example embodiment, the first electrode of the fourth transistor TR4 is a source electrode and the second electrode of the fourth transistor TR4 is a drain electrode. In another example embodiment, the first electrode of the fourth transistor TR4 is a drain electrode and the second electrode of the fourth transistor TR4 is a source electrode.

The fourth transistor TR4 applies the initialization voltage VINT to the gate electrode of the first transistor TR1 while the data initialization signal GI is active. The fourth transistor TR4 may operate in a linear region. Thus, the fourth transistor TR4 initializes the gate electrode of the first transistor TR1 to the initialization voltage VINT while the data initialization signal GI is active. In one example embodiment, the voltage level of the initialization voltage VINT is less than a voltage level of the data signal DATA maintained by the storage capacitor CST in a previous frame. The initialization voltage VINT is applied to the gate electrode of the first transistor TR1 that is a PMOS-type transistor. In another example embodiment, a voltage level of the initialization voltage VINT is higher than the voltage level of the data signal DATA maintained by the storage capacitor CST in a previous frame. The initialization voltage VINT is applied to the gate electrode of the first transistor TR1 that is a NMOS-type transistor.

In one example embodiment, the data initialization signal GI is identical to the scan signal GW advanced by one horizontal time. For example, the data initialization signal GI is applied to pixels located in the (n)th row and the data initialization signal GI is substantially the same as the scan signal GW applied to pixels located in the (n−1)th row. Thus, the data initialization signal GI that is active may be applied to pixels located in the (n)th row by applying the scan signal GW that is active to pixels located in the (n−1)th row. As a result, the gate electrode of the first transistor TR1 included in pixels located in the (n)th row is initialized to the initialization voltage VINT when the data signal DATA is applied pixels located in the (n−1)th row.

The fifth transistor TR5 includes a gate electrode, a first electrode and a second electrode. The emission signal EM is applied to the gate electrode. The first power voltage ELVDD is applied to the first electrode. The second electrode is connected to the first electrode of the first transistor TR1. In one example embodiment, the first electrode of the fifth transistor TR5 is a source electrode and the second electrode of fifth transistor TR5 is a drain electrode. In another example embodiment, the first electrode of the fifth transistor TR5 is a drain electrode and the second electrode of the fifth transistor TR5 is a source electrode.

The fifth transistor TR5 applies the first power voltage ELVDD to the first electrode of the first transistor TR1 while the emission signal EM is active. The fifth transistor TR5 does not apply the first power voltage ELVDD while the emission signal EM is inactive. The fifth transistor TR5 may operate in a linear region. The fifth transistor TR5 applies the first power voltage ELVDD to the first electrode of the first transistor TR1 while the emission signal EM is active such that the first transistor TR1 generates the driving current ID. In addition, the fifth transistor TR5 does not apply the first power voltage ELVDD while the emission signal EM is inactive such that the data signal DATA applied to the first electrode of the first transistor TR1 is applied to the gate electrode of the first transistor TR1.

The sixth transistor TR6 includes a gate electrode, a first electrode and a second electrode. The emission signal EM is applied to the gate electrode. The first electrode is connected to the second electrode of the first transistor TR1. The second electrode is connected to the first electrode of the OLED. In one example embodiment, the first electrode of the sixth transistor TR6 is a source electrode and the second electrode of sixth transistor TR6 is a drain electrode. In another example embodiment, the first electrode of the sixth transistor TR6 is a drain electrode and the second electrode of the sixth transistor TR6 is a source electrode.

The sixth transistor TR6 provides the driving current ID generated by the first transistor TR1 to the OLED while the emission signal EM is active. The sixth transistor TR6 may operate in a linear region. Thus, the sixth transistor TR6 provides the driving current ID generated by the first transistor TR1 to the OLED while the emission signal EM is active such that the OLED emits light. In addition, the sixth transistor TR6 disconnects the first transistor TR1 from the OLED while the emission signal EM is inactive such that the compensated data signal DATA applied to the second electrode of the first transistor TR1 is applied to the gate electrode of the first transistor TR1.

The seventh transistor TR7 includes a gate electrode, a first electrode and a second electrode. The diode initialization signal GB is applied to the gate electrode. The initialization voltage VINT is applied to the first electrode. The second electrode is connected to the first electrode of the OLED. In one example embodiment, the first electrode of the seventh transistor TR7 is a source electrode and the second electrode of seventh transistor TR7 is a drain electrode. In another example embodiment, the first electrode of the seventh transistor TR7 is a drain electrode and the second electrode of the seventh transistor TR7 is a source electrode.

The seventh transistor TR7 applies the initialization voltage VINT to the first electrode of the OLED while the diode initialization signal GB is active. The seventh transistor TR7 may operate in a linear region. Thus, the seventh transistor TR7 initializes the first electrode of the OLED to the initialization voltage VINT while the diode initialization signal GB is active. The initial change in charge of the diode parallel capacitor CEL can be calculated according to the above Equation 1.

In one example embodiment, the data initialization signal GI and the diode initialization signal GB are the same signal. An initialization operation of the gate electrode of the first transistor TR1 does not affect an initialization operation of the first electrode of the OLED. Therefore, the data initialization signal GI is used as the diode initialization signal GB, thereby improving the manufacturing efficiency.

The voltage difference between the electrodes of the OLED is less than a threshold voltage of the OLED when the OLED does not emit light. The OLED emits light when the voltage difference is greater than the threshold voltage. Therefore, the voltage difference reaches the threshold voltage and emits light when a threshold charge is stored in the diode parallel capacitor CEL. The threshold charge can be calculated according to the above Equation 2.

In one example embodiment, the driving current ID is not zero due to a leakage current generated from the first transistor TR1 when the OLED is representing a black grayscale (i.e., the grayscale is zero). However the leakage current can flow through the diode parallel capacitor CEL instead of the OLED until the voltage difference between both electrodes of the OLED reaches the threshold voltage. The OLED does not emit the light while the diode parallel capacitor CEL is charged by the leakage current until it reaches the threshold charge. For example, if the leakage current is fixed, the initialization voltage VINT can be calculated according to the above Equation 3.

The response speed improvement capacitor C1 is connected between the gate electrode of the first transistor TR1 and the first electrode of the first transistor TR1. The voltage difference between the gate electrode and the source electrode (i.e., first electrode) of the first transistor TR1 is increased by the response speed improvement capacitor C1, thereby reducing a delay for generating the driving current ID by the first transistor TR1 when the emission signal EM is active. As a result, the response speed of the OLED is increased. In other words, the response speed of the OLED is increased when the voltage difference between the gate electrode and the source electrode of the first transistor TR1 is increased while the data initialization signal GI is active. In one example embodiment, the voltage level of the gate electrode of the first transistor TR1 that is a PMOS-type transistor is substantially the same as a voltage level of the initialization voltage VINT while the data initialization signal GI is active. The response speed of the OLED is increased when the voltage level of the first electrode of the first transistor TR1 is greater than the voltage level of the gate electrode of the first transistor TR1 while the data initialization signal GI is active. In another example embodiment, if the first transistor TR1 is an NMOS-type transistor, the response speed of the OLED is increased when the voltage level of the first electrode of the first transistor TR1 is less than the voltage level of the gate electrode of the first transistor TR1 while the data initialization signal GI is active.

As a result, the response speed of the OLED can be increased because the capacitor transistor TR8 increases the voltage difference between the gate electrode and the first electrode of the first transistor TR1 while the data initialization signal GI is active. In addition, the additional process of FIG. 1 for manufacturing the source connection capacitor C2 is not needed. Hereinafter, a method of forming the capacitor transistor TR8 without additional manufacturing process will be described in detail with reference to FIGS. 7 and 8.

Figure 4:
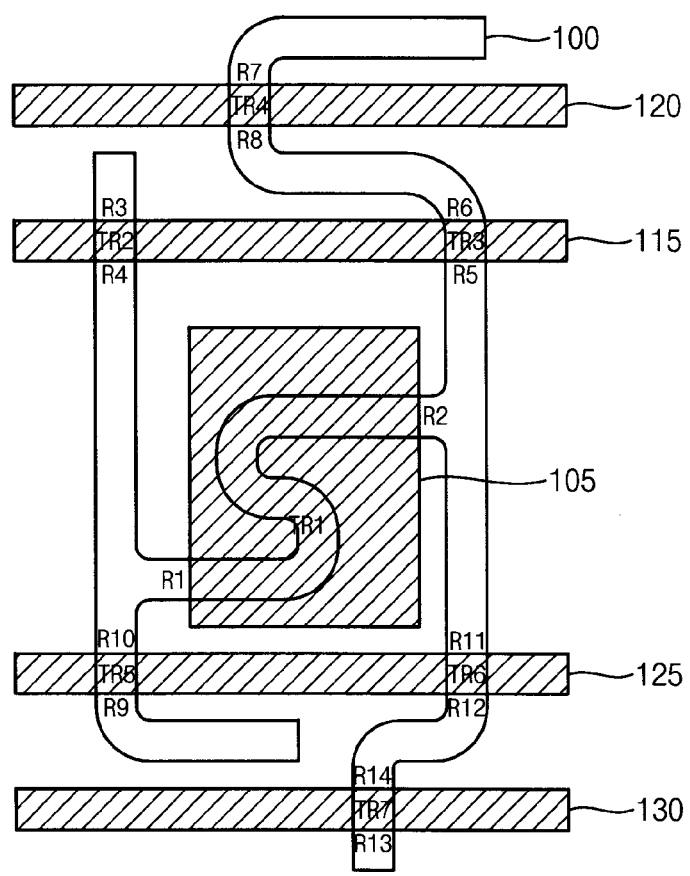
FIGS. 4 through 6 are plan views illustrating an example of an OLED display for increasing the response speed of an OLED according to an embodiment.
Figure 5:
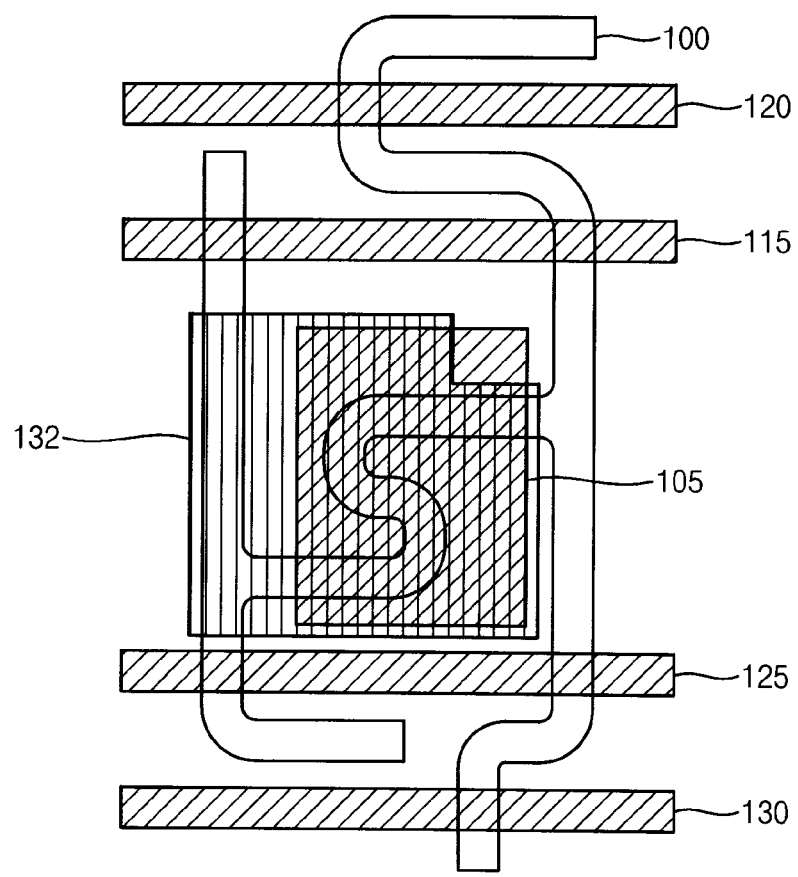
Figure 6:
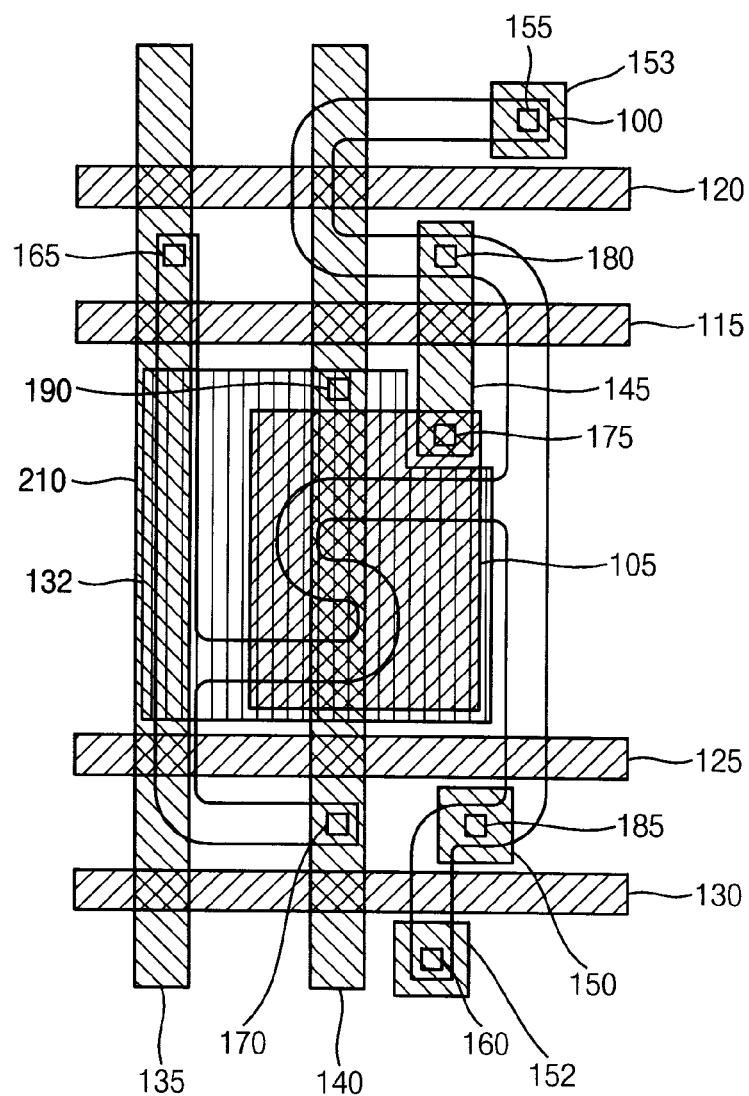

FIGS. 4 through 6 are plan views illustrating an example of an OLED display increasing a response speed of an OLED.

Referring to FIG. 4, the OLED display includes a substrate, an active pattern 100, a gate insulation layer, a first gate electrode 105, a third gate electrode 115, a fourth gate electrode 120, a fifth gate electrode 125, and a sixth gate electrode 130.

The substrate includes an insulation material. For example, the substrate may include one or more of the following materials" a glass substrate, a transparent plastic substrate, a transparent metal oxide substrate, etc. Also, a buffer layer is formed on the substrate. For example, the buffer layer can be formed of one or more of the following materials: a silicon oxide (SiOx), silicon nitride (SiNx), silicon oxide nitride (SiOxNy), etc.

The active pattern 100 is formed on the substrate. In one example embodiment, the active pattern 100 includes silicon (Si). In another example embodiment, the active pattern 100 includes a semiconductor oxide containing a binary compound (ABx), a ternary compound (ABxCy) and/or a quaternary compound (ABxCyDz). For example, the active pattern 100 may include one or more of the following materials: indium (In), zinc (Zn), gallium (Ga), stannum (Sn), titanium (Ti), aluminum (Al), hafnium (Hf), zirconium (Zr) and/or magnesium (Mg).

The active pattern 100 includes first through fourteenth regions R1 through R14. The first through fourteenth regions R1 through R14 are doped by an impurity such that the first through fourteenth regions R1 through R14 have a higher electrical conductivity than other regions of the active pattern 100. The first through fourteenth regions R1 through R14 form source or drain electrodes of first through seventh transistors TR1 through TR7. The boundaries of the first through fourteenth regions R1 through R14 may not be clearly divided and may be electrically connected to each other.

The gate insulation layer covers the active pattern 100 and is formed on the substrate. In one example embodiment, the gate insulation layer sufficiently covers the active pattern 100, thereby forming a substantially flat surface without a step difference. The gate insulation layer may include one or more of the following materials: a silicon compound, metal oxide, etc. For example, the gate insulation layer may be formed using one or more of the following materials: silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in combination. In addition, the gate insulation layer may have a single layer structure or a multi layer structure including the silicon oxide and/or the silicon nitride.

The first gate electrode 105, the third gate electrode 115, the fourth gate electrode 120, the fifth gate electrode 125, and the sixth gate electrode 130 are formed on the gate insulation layer. The first gate electrode 105, the third gate electrode 115, the fourth gate electrode 120, the fifth gate electrode 125, and the sixth gate electrode 130 may include one or more of the following materials: metal, alloy, conductive metal oxide, a transparent conductive material, etc. For example, the first gate electrode 105, the third gate electrode 115, the fourth gate electrode 120, the fifth gate electrode 125, and the sixth gate electrode 130 may be formed using one or more of the following materials: aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These may be used alone or in combination.

The first gate electrode 105 forms a first transistor TR1 with the first region R1 and the second region R2. In one example embodiment, the first region R1 is a source region and the second region R2 is a drain region. In another example embodiment, the first region R1 is a drain region and the second region R2 is a source region. The first region R1 and the second region R2 are formed by doping with an impurity. On the other hand, a portion of the active pattern 100 located below the first gate electrode 105 does not contain the impurity. The first and second regions R1 and R2 act as a conductor. The portion of the active pattern 100 located below the first gate electrode 105 acts as a channel. As a result, the first transistor TR1 generates the driving current ID provided to the OLED and the OLED emits light based on the driving current ID.

The third gate electrode 115 forms a second transistor TR2 with the third region R3 and the fourth region R4. In one example embodiment, the third region R3 is a source region and the fourth region R4 is a drain region. In another example embodiment, the third region R3 is a drain region and the fourth region R4 is a source region. Also, the third gate electrode 115 forms a third transistor TR3 with the fifth region R5 and the sixth region R6. In one example embodiment, the fifth region R5 is a source region and the sixth region R6 is a drain region. In another example embodiment, the fifth region R5 is a drain region and the sixth region R6 is a source region. The fourth region R4 is electrically connected to the first region R1. The fifth region R5 is electrically connected to the second region R2. The third through sixth regions R3 through R6 are formed by doping with the impurity. On the other hand, a portion of the active pattern 100 located below the third gate electrode 115 does not contain the impurity. As a result, the third through sixth regions R3 through R6 act as a conductor. The portion of the active pattern 100 located below the third gate electrode 115 acts as a channel of the second and third transistors TR2 and TR3. In one example embodiment, the scan signal GW of FIG. 1 is applied to the third gate electrode 115.

The fourth gate electrode 120 forms a fourth transistor TR4 with the seventh region R7 and the eighth region R8. In one example embodiment, the seventh region R7 is a source region and the eighth region R8 is a drain region. In another example embodiment, the seventh region R7 is a drain region and the eighth region R8 is a source region. The eighth region R8 is electrically connected to the sixth region R6. The seventh region R7 and the eighth region R8 are formed by doping with the impurity. On the other hand, a portion of the active pattern 100 located below the fourth gate electrode 120 does not contain the impurity. As a result, the seventh and eighth regions R7 and R8 act as a conductor. The portion of the active pattern 100 located below the fourth gate electrode 120 acts as a channel of the fourth transistor TR4. In one example embodiment, the data initialization signal GI of FIG. 1 is applied to the fourth gate electrode 120.

The fifth gate electrode 125 forms a fifth transistor TR5 with the ninth region R9 and the tenth region R10. In one example embodiment, the ninth region R9 is a source region and the tenth region R10 is a drain region. In another example embodiment, the ninth region R9 is a drain region and the tenth region R10 is a source region. Also, the fifth gate electrode 125 forms a six transistor TR6 with the eleventh region R11 and the twelfth region R12. In one example embodiment, the eleventh region R11 is a source region and the twelfth region R12 is a drain region. In another example embodiment, the eleventh region R11 is a drain region and the twelfth region R12 is a source region. The tenth region R10 is electrically connected to the first region R1. The eleventh region R11 is electrically connected to the second region R2. The ninth through twelfth regions R9 through R12 are formed by doping with the impurity. On the other hand, a portion of the active pattern 100 located below the fifth gate electrode 125 does not contain the impurity. As a result, the ninth through twelfth regions R9 through R12 act as a conductor. The portion of the active pattern 100 located below the fifth gate electrode 125 acts as a channel of the fifth and sixth transistors TR5 and TR6. In one example embodiment, the emission signal EM of FIG. 1 is applied to the fifth gate electrode 125.

The sixth gate electrode 130 forms a seventh transistor TR7 with the thirteenth region R13 and the fourteenth region R14. In one example embodiment, the thirteenth region R13 is a source region and the fourteenth region R14 is a drain region. In another example embodiment, the thirteenth region R13 is a drain region and the fourteenth region R14 is a source region. The fourteenth region R14 is electrically connected to the twelfth region R12. The thirteenth through fourteenth regions R13 and R14 are formed by doping with the impurity. On the other hand, a portion of the active pattern 100 located below the sixth gate electrode 130 does not contain the impurity. As a result, the thirteenth and fourteenth regions R13 and R14 act as a conductor. The portion of the active pattern 100 located below the sixth gate electrode 130 acts as a channel of the seventh transistor TR7. In one example embodiment, the diode initialization signal GB of FIG. 1 is applied to the sixth gate electrode 130. In one example embodiment, the initialization voltage VINT is applied to the seventh and thirteenth regions R7 and R13.

Referring to FIG. 5, the OLED display includes a substrate, an active pattern 100, a gate insulation layer, a first gate electrode 105, a third gate electrode 115, a fourth gate electrode 120, a fifth gate electrode 125, and a sixth gate electrode 130. In addition, the OLED display further includes an additional insulation interlayer and an additional capacitor pattern 132.

The additional insulation interlayer covers the first gate electrode 105, the third gate electrode 115, the fourth gate electrode 120, the fifth gate electrode 125, and the sixth gate electrode 130 and is formed over the gate insulation layer. In one example embodiment, the additional insulation interlayer sufficiently covers the first gate electrode 105, the third gate electrode 115, the fourth gate electrode 120, the fifth gate electrode 125, and the sixth gate electrode 130, thereby forming a substantially flat surface without a step difference. The additional insulation interlayer may include an organic material such as silicon compound, or an inorganic material such as transparent insulation resin. For example, the additional insulation interlayer may be formed using one or more of the following materials: silicon oxide (SiOx), silicon nitride (SiNx), silicon oxynitride (SiOxNy), etc. These may be used alone or in combination.

The additional capacitor pattern 132 is formed on the additional insulation interlayer and partially overlaps the first gate electrode 105. The additional capacitor pattern 132 is formed using one or more of the following materials: metal, alloy, metal nitride, conductive metal oxide, a transparent conductive material, etc. These may be used alone or in combination.

The additional capacitor pattern 132 forms the storage capacitor CST of FIG. 1 with the first gate electrode 105. A portion of the active pattern 100 excluding a region located below the first gate electrode 105, the third gate electrode 115, the fourth gate electrode 120, the fifth gate electrode 125, and the sixth gate electrode 130 is doped with the impurity. The additional capacitor pattern 132 is formed after the doping process is finished. Therefore, a portion of the active pattern 100 located below the additional capacitor pattern 132 acts as a conductor. As a result, the additional capacitor pattern 132 forms the source connection capacitor C2 of FIG. 1 with the portion of the active pattern 100 located below the additional capacitor pattern 132.

Referring to FIG. 6, the OLED display includes a substrate, an active pattern 100, a gate insulation layer, a first gate electrode 105, a third gate electrode 115, a fourth gate electrode 120, a fifth gate electrode 125, a sixth gate electrode 130, an additional insulation interlayer, and an additional capacitor pattern 132. In addition, the OLED display further includes a first insulation interlayer, a data pattern 135, a power pattern 140, a first connection pattern 145, and a second connection pattern 150. In one example embodiment, the OLED display further includes a third connection pattern 152 and a fourth connection pattern 153.

The first insulation interlayer covers the additional capacitor pattern 132 and is formed on the additional insulation interlayer. In one example embodiment, the first insulation interlayer sufficiently covers the additional capacitor pattern 132, thereby forming a substantially flat surface without a step difference. The first insulation interlayer includes an organic material such as silicon compound, or an inorganic material such as transparent insulation resin. For example, the first insulation interlayer may be formed using one or more of the following materials: silicon oxide (SiOx), silicon nitride (SiNx), silicon oxynitride (SiOxNy), etc. These may be used alone or in combination.

The data pattern 135, the power pattern 140, the first connection pattern 145, the second connection pattern 150, the third connection pattern 152, and the fourth connection pattern 153 are formed on the first insulation interlayer. The data pattern 135, the power pattern 140, the first connection pattern 145, the second connection pattern 150, the third connection pattern 152, and the fourth connection pattern 153 may be formed using one or more of the following materials: metal, alloy, metal nitride, conductive metal oxide, a transparent conductive material, etc. These may be used alone or in combination.

The data pattern 135 contacts the third region R3. For example, the data pattern 135 may contact the third region R3 through a first contact hole 165. In one example embodiment, the data pattern 135 receives the data signal DATA of FIG. 1. As a result, the data pattern 135 provides the data signal DATA to the third region R3 through the first contact hole 165.

The power pattern 140 contacts the ninth region R9 and the additional capacitor pattern 132. For example, the power pattern 140 may contact the ninth region R9 through a second contact hole 170 and contact the additional capacitor pattern 132 through an additional contact hole 190. In one example embodiment, the power pattern 140 receives the first power supply voltage ELVDD of FIG. 1. As a result, the power pattern 140 provides the first power supply voltage ELVDD to the ninth region R9 through the second contact 170 and provides the first power supply voltage ELVDD to the additional capacitor pattern 132 through the additional contact hole 190.

The first connection pattern 145 contacts the first gate electrode 105 and the eighth region R8. For example, the first connection pattern 145 contacts the first gate electrode 105 through a third contact hole 175 and contacts the eighth region R8 through a fourth contact hole 180. As a result, the first connection pattern 145 electrically connects the first gate electrode 105 to the eighth region R8 through the third contact hole 175 and the fourth contact hole 180.

The second connection pattern 150 contacts the twelfth region R12. For example, the second connection pattern 150 contacts the twelfth region R12 through a fifth contact hole 185. As a result the second connection pattern 150 provides the driving current ID of FIG. 1 generated by the first transistor TR1 to the OLED that is formed on the second connection pattern 150.

The third connection pattern 152 contacts the thirteenth region R13. For example, the third connection pattern 152 contacts the thirteenth region R13 through a sixth contact hole 160. In one example embodiment, the third connection pattern 152 receives the initialization voltage VINT of FIG. 1. As a result, the third connection pattern 152 provides the initialization voltage VINT to the thirteenth region R13 through the sixth contact hole 160.

The fourth connection pattern 153 contacts the seventh region R7. For example, the fourth connection pattern 153 contacts the seventh region R7 through a seventh contact hole 155. In one example embodiment, the fourth connection pattern 153 receives the initialization voltage VINT of FIG. 1. As a result, the fourth connection pattern 153 provides the initialization voltage VINT to the seventh region R7 through the seventh contact hole 155.

In one example embodiment, the OLED display further includes a second insulation interlayer, a first electrode, a pixel defining layer, an organic light-emitting layer, and a second electrode.

The second insulation interlayer covers the data pattern 135, the power pattern 140, the first connection pattern 145, and the second connection pattern 150 and is formed on the first insulation interlayer. In one example embodiment, the second insulation interlayer sufficiently covers the data pattern 135, the power pattern 140, the first connection pattern 145, and the second connection pattern 150, thereby forming a substantially flat surface without a step difference. The second insulation interlayer includes an organic material such silicon compound, or an inorganic material such as transparent insulation resin. For example, the second insulation interlayer may be formed using one of the following materials: silicon oxide (SiOx), silicon nitride (SiNx), silicon oxynitride (SiOxNy), etc. These may be used alone or in combination.

The first electrode is formed on the second insulation interlayer. Specifically, the first electrode is formed on a portion of the second insulation interlayer. The first electrode may be formed using one or more of the following materials: metal, alloy, metal nitride, conductive metal oxide, a transparent conductive material, etc. These may be used alone or in combination.

The first electrode contacts the second connection pattern 150. For example, the first electrode contacts the second connection pattern 150 through an eighth contact hole. As a result, the first electrode receives the driving current ID through the eighth contact hole. In one example embodiment, the first electrode is an anode electrode. In another example embodiment, the first electrode is a cathode electrode.

The pixel defining layer is formed on the second insulation interlayer. Specifically, the pixel defining layer is formed on a portion of the second insulation interlayer and the first electrode. In one example embodiment, the pixel defining layer sufficiently covers the second insulation interlayer and the first electrode, thereby forming a substantially flat surface without a step difference. The pixel defining layer is partially etched to form an opening that exposes the first electrode. The organic light-emitting layer is formed in the opening. The pixel defining layer can include an organic material or an inorganic material.

The organic light-emitting layer is formed on the first electrode. Specifically, the organic light-emitting layer is formed on the first electrode exposed by the opening formed in the pixel defining layer. The organic light-emitting layer includes an organic material that can emit light. In one example embodiment, the organic light-emitting layer includes an organic material that emits one of a red, green or blue color light.

The second electrode is formed on the pixel defining layer and the organic light-emitting layer. In one example embodiment, the second electrode includes a transparent conductive material. For example, the second electrode may be formed using one or more of the following materials: zinc oxide (ZnOx), indium tin oxide (ITO), tin oxide (SnOx), indium oxide (InOx), gallium oxide (GaOx), indium zinc oxide (IZO), etc. In one example embodiment, the second electrode is a cathode electrode. In another example embodiment, the first electrode is an anode electrode. Thus, the second electrode forms the OLED with the organic light-emitting layer and the first electrode. In one example embodiment, the second electrode receives the second power supply voltage ELVSS of FIG. 1.

Therefore, the OLED display of FIGS. 4 through 6 includes the pixel 10 of FIG. 1 capable of increasing a response speed of an OLED. However, the OLED display of FIGS. 4 through 6 is manufactured by additional processes for forming the additional insulation interlayer, the additional capacitor pattern 132, and the additional contact hole 190 to manufacture the storage capacitor CST and the source connection capacitor C2. For example, the OLED display of FIGS. 4 through 6 may be manufactured by a total of eight mask processes.

Figure 7:
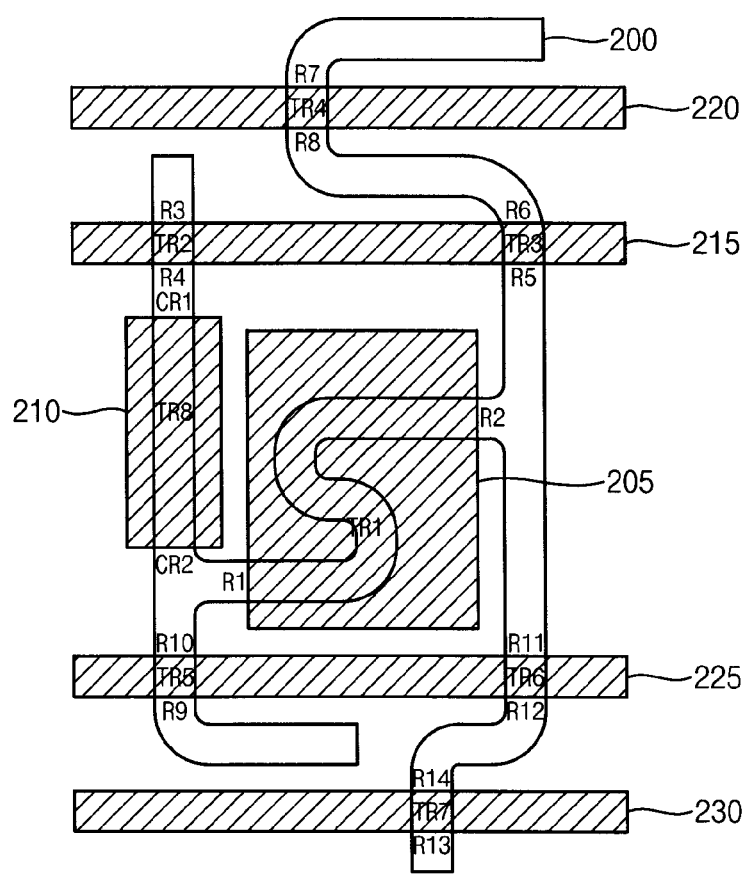
FIGS. 7 and 8 are plan views illustrating an OLED display according to example embodiments.
Figure 8:
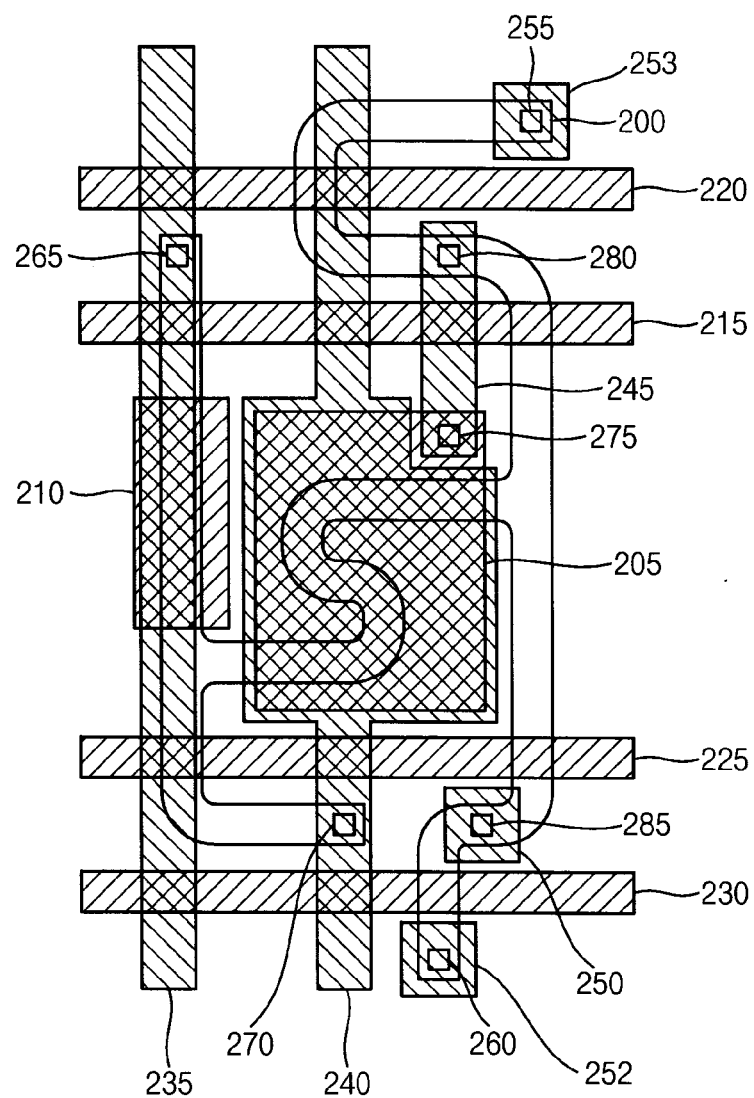

FIGS. 7 and 8 are plan views illustrating an OLED display according to example embodiments.

Referring to FIG. 7, the OLED display includes a substrate, an active pattern 200, a gate insulation layer, a first gate electrode 205, a second gate electrode 210, a third gate electrode 215, a fourth gate electrode 220, a fifth gate electrode 225, and a sixth gate electrode 230.

The substrate includes an insulation material. For example, the substrate includes a glass substrate, a transparent plastic substrate, a transparent metal oxide substrate, etc. Also, a buffer layer may be formed on the substrate. For example, the buffer layer may include one or more of the following materials: a silicon oxide (SiOx), silicon nitride (SiNx), silicon oxide nitride (SiOxNy), etc.

The active pattern 200 is formed on the substrate. In one example embodiment, the active pattern 200 includes silicon (Si). In another example embodiment, the active pattern 200 includes a semiconductor oxide containing a binary compound (ABx), a ternary compound (ABxCy) and/or a quaternary compound (ABxCyDz). For example, the active pattern 200 may include one or more of the following materials: indium (In), zinc (Zn), gallium (Ga), stannum (Sn), titanium (Ti), aluminum (Al), hafnium (Hf), zirconium (Zr) and/or magnesium (Mg).

The active pattern 200 includes first through fourteenth regions R1 through R14, a first capacitor region CR1, and a second capacitor region CR2. The first through fourteenth regions R1 through R14, the first capacitor region CR1, and the second capacitor region CR2 are used to form source or drain electrodes of first through seventh transistors TR1 through TR7 and a capacitor transistor TR8. The boundaries of the first through fourteenth regions R1 through R14 may not be clearly divided and may be electrically connected to each other. For example, the boundaries of the second region R2, the fifth region R5, and the eleventh region R11 are not clearly divided and are electrically connected to each other.

The gate insulation layer covers the active pattern 200 and is formed on the substrate. In one example embodiment, the gate insulation layer sufficiently covers the active pattern 200, thereby forming a substantially flat surface without a step difference. The gate insulation layer include one or more of the following materials: a silicon compound, metal oxide, etc. For example, the gate insulation layer may be formed using one or more of the following materials: silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in combination. In addition, the gate insulation layer may have a single layer structure or a multi layer structure including the silicon oxide and/or the silicon nitride.

The first through sixth gate electrodes 205, 210, 215, 220, 225, 230 are formed on the gate insulation layer. The first through sixth gate electrodes 205, 210, 215, 220, 225, 230 may include one or more of the following materials: metal, alloy, conductive metal oxide, a transparent conductive material, etc. For example, the first through sixth gate electrodes 205, 210, 215, 220, 225, 230 may be formed using one or more of the following materials: aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These may be used alone or in combination.

The first gate electrode 205 forms a first transistor TR1 with the first region R1 and the second region R2. In one example embodiment, the first region R1 is a source region and the second region R2 is a drain region. In another example embodiment, the first region R1 is a drain region and the second region R2 is a source region. The first region R1 and the second region R2 are formed by doping with an impurity. On the other hand, a portion of the active pattern 200 located below the first gate electrode 205 does not contain the impurity. The first region R1 and the act as a conductor. The portion of the active pattern 200 located below the first gate electrode 205 acts as a channel. As a result, the first transistor TR1 generates the driving current ID provided to the OLED and the OLED emits light based on the driving current ID.

The second gate electrode 210 forms the capacitor transistor TR8 with the first capacitor region CR1 and the second capacitor region CR2. In one example embodiment, the first capacitor region CR1 is a source region and the second capacitor region CR2 is a drain region. In another example embodiment, the first capacitor region CR1 is a drain region and the second capacitor region CR2 is a source region. The second capacitor region CR2 is electrically connected to the first region R1. The first capacitor region CR1 and the second capacitor region CR2 are formed by doping with the impurity. On the other hand, a portion of the active pattern 200 located below the second gate electrode 210 does not contain the impurity. As a result, the first capacitor region CR1 and the second capacitor region CR2 act as a conductor. The portion of the active pattern 200 located below the second gate electrode 210 acts as the channel of the capacitor transistor TR8.

The second gate electrode 210 receives a gate turn-on voltage. The gate turn-on voltage activates a channel that is a portion of the active pattern 200 located below the second gate electrode 210. As a result, the capacitor transistor TR8 functions as a capacitor using the activated channel as a first electrode and the second gate electrode 210 as a second electrode. In one example embodiment, the gate turn-on voltage has a low voltage level to activate the channel of the capacitor transistor TR8 that is PMOS-type transistor. In another example embodiment, the gate turn-on voltage has a high voltage level to activate the channel of the capacitor transistor TR8 that is NMOS-type transistor.

The third gate electrode 215 forms a second transistor TR2 with the third region R3 and the fourth region R4. In one example embodiment, the third region R3 is a source region and the fourth region R4 is a drain region. In another example embodiment, the third region R3 is a drain region and the fourth region R4 is a source region. Also, the third gate electrode 215 forms a third transistor TR3 with the fifth region R5 and the sixth region R6. In one example embodiment, the fifth region R5 is a source region and the sixth region R6 is a drain region. In another example embodiment, the fifth region R5 is a drain region and the sixth region R6 is a source region. The fourth region R4 is electrically connected to the first capacitor region CR1. The fifth region R5 is electrically connected to the second region R2. The third through sixth regions R3 through R6 are formed by doping with the impurity. On the other hand, a portion of the active pattern 200 located below the third gate electrode 215 does not contain the impurity. As a result, the third through sixth regions R3 through R6 act as a conductor. The portion of the active pattern 200 located below the third gate electrode 215 acts as a channel of the second and third transistors TR2 and TR3. In one example embodiment, the scan signal GW of FIG. 2 is applied to the third gate electrode 215.

The fourth gate electrode 220 forms a fourth transistor TR4 with the seventh region R7 and the eighth region R8. In one example embodiment, the seventh region R7 is a source region and the eighth region R8 is a drain region. In another example embodiment, the seventh region R7 is a drain region and the eighth region R8 is a source region. The eighth region R8 is electrically connected to the sixth region R6. The seventh region R7 and the eighth region R8 are formed by doping with the impurity. On the other hand, a portion of the active pattern 200 located below the fourth gate electrode 220 does not contain the impurity. As a result, the seventh and eighth regions R7 and R8 act as a conductor. The portion of the active pattern 200 located below the fourth gate electrode 220 acts as a channel of the fourth transistor TR4. In one example embodiment, the data initialization signal GI of FIG. 2 is applied to the fourth gate electrode 220.

The fifth gate electrode 225 forms a fifth transistor TR5 with the ninth region R9 and the tenth region R10. In one example embodiment, the ninth region R9 is a source region and the tenth region R10 is a drain region. In another example embodiment, the ninth region R9 is a drain region and the tenth region R10 is a source region. Also, the fifth gate electrode 225 forms a six transistor TR6 with the eleventh region R11 and the twelfth region R12. In one example embodiment, the eleventh region R11 is a source region and the twelfth region R12 is a drain region. In another example embodiment, the eleventh region R11 is a drain region and the twelfth region R12 is a source region. The tenth region R10 is electrically connected to the first region R1. The eleventh region R11 is electrically connected to the second region R2. The ninth through twelfth regions R9 through R12 are formed by doping with the impurity. On the other hand, a portion of the active pattern 200 located below the fifth gate electrode 225 does not contain the impurity. As a result, the ninth through twelfth regions R9 through R12 act as a conductor. The portion of the active pattern 200 located below the fifth gate electrode 225 acts as the channel of the fifth and sixth transistors TR5 and TR6. In one example embodiment, the emission signal EM of FIG. 2 is applied to the fifth gate electrode 225.

The sixth gate electrode 230 forms a seventh transistor TR7 with the thirteenth region R13 and the fourteenth region R14. In one example embodiment, the thirteenth region R13 is a source region and the fourteenth region R14 is a drain region. In another example embodiment, the thirteenth region R13 is a drain region and the fourteenth region R14 is a source region. The fourteenth region R14 is electrically connected to the twelfth region R12. The thirteenth through fourteenth regions R13 and R14 are formed by doping with the impurity. On the other hand, a portion of the active pattern 200 located below the sixth gate electrode 230 does not contain the impurity. As a result, the thirteenth and fourteenth regions R13 and R14 act as a conductor. The portion of the active pattern 200 located below the sixth gate electrode 230 acts as a channel of the seventh transistor TR7. In one example embodiment, the diode initialization signal GB of FIG. 2 is applied to the sixth gate electrode 230. In one example embodiment, the initialization voltage VINT is applied to the seventh and thirteenth regions R7 and R13.

Referring to FIG. 8, the OLED display includes a substrate, an active pattern 200, a gate insulation layer, a first gate electrode 205, a second gate electrode 210, a third gate electrode 215, a fourth gate electrode 220, a fifth gate electrode 225, and a sixth gate electrode 230. In addition, the OLED display further includes a first insulation interlayer, a data pattern 235, a power pattern 240, a first connection pattern 245, and a second connection pattern 250. In one example embodiment, the OLED display further includes a third connection pattern 252 and a fourth connection pattern 253.

The first insulation interlayer covers the first through sixth gate electrodes 205, 210, 215, 220, 225, 230 and is formed on the gate insulation layer. In one example embodiment, the first insulation interlayer sufficiently covers the first through sixth gate electrodes 205, 210, 215, 220, 225, 230, thereby forming a substantially flat surface without a step difference. The first insulation interlayer includes an organic material such as silicon compound, or an inorganic material such as transparent insulation resin. For example, the first insulation interlayer can be formed using one or more of the following materials: silicon oxide (SiOx), silicon nitride (SiNx), silicon oxynitride (SiOxNy), etc. These may be used alone or in combination.

The data pattern 235, the power pattern 240, the first connection pattern 245, and the second connection pattern 250 are formed on the first insulation interlayer. The data pattern 235, the power pattern 240, the first connection pattern 245, and the second connection pattern 250 may be formed using one or more of the following materials: metal, alloy, metal nitride, conductive metal oxide, a transparent conductive material, etc. These may be used alone or in combination.

The data pattern 235 contacts the third region R3. For example, the data pattern 235 contacts the third region R3 through a first contact hole 265. In one example embodiment, the data pattern 235 receives the data signal DATA of FIG. 2. As a result, the data pattern 235 provides the data signal DATA to the third region R3 through the first contact hole 265.

The power pattern 240 forms the storage capacitor with the first gate electrode 205. For example, the storage capacitor CST of FIG. 2 is formed using the first gate electrode 205 as a first electrode and the power pattern 240 as a second electrode. The power pattern 240 contacts the ninth region R9. For example, the power pattern 240 contacts the ninth region R9 through a second contact hole 270. In one example embodiment, the power pattern 240 receives the first power supply voltage ELVDD of FIG. 2. As a result, the power pattern 240 provides the first power supply voltage ELVDD to the ninth region R9 through the second contact 270.

The first connection pattern 245 contacts the first gate electrode 205 and the eighth region R8. For example, the first connection pattern 245 contacts the first gate electrode 205 through a third contact hole 275 and contacts the eighth region R8 through a fourth contact hole 280. As a result, the first connection pattern 245 electrically connects the first gate electrode 205 to the eighth region R8 through the third contact hole 275 and the fourth contact hole 280.

The second connection pattern 250 contacts the twelfth region R12. For example, the second connection pattern 250 contacts the twelfth region R12 through a fifth contact hole 285. As a result the second connection pattern 250 provides the driving current ID of FIG. 2 generated by the first transistor TR1 to the OLED that is formed on the second connection pattern 250.

The third connection pattern 252 contacts the thirteenth region R13. For example, the third connection pattern 252 contacts the thirteenth region R13 through a sixth contact hole 260. In one example embodiment, the third connection pattern 252 receives the initialization voltage VINT of FIG. 2. As a result, the third connection pattern 252 provides the initialization voltage VINT to the thirteenth region R13 through the sixth contact hole 260.

The fourth connection pattern 253 contacts the seventh region R7. For example, the fourth connection pattern 253 contacts the seventh region R7 through a seventh contact hole 255. In one example embodiment, the fourth connection pattern 253 receives the initialization voltage VINT of FIG. 2. As a result, the fourth connection pattern 253 provides the initialization voltage VINT to the seventh region R7 through the seventh contact hole 255.

In one example embodiment, the OLED display further includes a second insulation interlayer, a first electrode, a pixel defining layer, an organic light-emitting layer, and a second electrode.

The second insulation interlayer covers the data pattern 235, the power pattern 240, the first connection pattern 245, and the second connection pattern 250 and is formed on the first insulation interlayer. In one example embodiment, the second insulation interlayer sufficiently covers the data pattern 235, the power pattern 240, the first connection pattern 245, and the second connection pattern 250, thereby forming a substantially flat surface without a step difference. The second insulation interlayer includes an organic material such as a silicon compound or an inorganic material such as a transparent insulation resin. For example, the second insulation interlayer may be formed using one or more of the following materials: silicon oxide (SiOx), silicon nitride (SiNx), silicon oxynitride (SiOxNy), etc. These may be used alone or in combination.

The first electrode is formed on the second insulation interlayer. Specifically, the first electrode is formed on a portion of the second insulation interlayer. The first electrode may be formed using one or more of the following materials: metal, alloy, metal nitride, conductive metal oxide, a transparent conductive material, etc. These may be used alone or in combination.

The first electrode contacts the second connection pattern 250. For example, the first electrode contacts the second connection pattern 250 through an eighth contact hole. As a result, the first electrode receives the driving current ID through the eighth contact hole. In one example embodiment, the first electrode is an anode electrode. In another example embodiment, the first electrode is a cathode electrode.

The pixel defining layer is formed on the second insulation interlayer. Specifically, the pixel defining layer is formed on a portion of the second insulation interlayer and the first electrode. In one example embodiment, the pixel defining layer sufficiently covers the second insulation interlayer and the first electrode, thereby forming a substantially flat surface without a step difference. The pixel defining layer is partially etched to form an opening that exposes the first electrode. The organic light-emitting layer is formed in the opening. The pixel defining layer includes an organic material or an inorganic material.

The organic light-emitting layer is formed on the first electrode. Specifically, the organic light-emitting layer is formed on the first electrode exposed by the opening formed by the pixel defining layer. The organic light-emitting layer includes an organic material that can emit light. In one example embodiment, the organic light-emitting layer includes an organic material that can emit one of red, green or blue colored light.

The second electrode is formed on the pixel defining layer and the organic light-emitting layer. In one example embodiment, the second electrode includes a transparent conductive material. For example, the second electrode is formed using one or more of the following materials: zinc oxide (ZnOx), indium tin oxide (ITO), tin oxide (SnOx), indium oxide (InOx), gallium oxide (GaOx), indium zinc oxide (IZO), etc. In one example embodiment, the second electrode is a cathode electrode. In another example embodiment, the first electrode is an anode electrode. Thus, the second electrode may compose the OLED with the organic light-emitting layer and the first electrode. In one example embodiment, the second electrode receives the second power supply voltage ELVSS of FIG. 2.

Hereinafter, the substrate, the gate insulation layer, the first insulation interlayer, the second insulation interlayer, the first electrode, the pixel defining layer, the organic light-emitting layer, and the second electrode will be described in detail with reference to the FIG. 9.

Therefore, the OLED display of FIGS. 7 and 8 can include the pixel 20 of FIG. 2 capable of increasing a response speed of an OLED. In addition, the OLED display of FIGS. 7 and 8 can be manufactured without additional manufacturing process for manufacturing the source connection capacitor C2 of FIG. 1 (e.g., forming the additional insulation interlayer, the additional capacitor pattern, and the additional contact hole shown in FIGS. 4 through 6), thereby reducing the manufacturing cost. For example, the OLED display of FIGS. 7 and 8 can be manufactured by seven mask processes.

Figure 9:
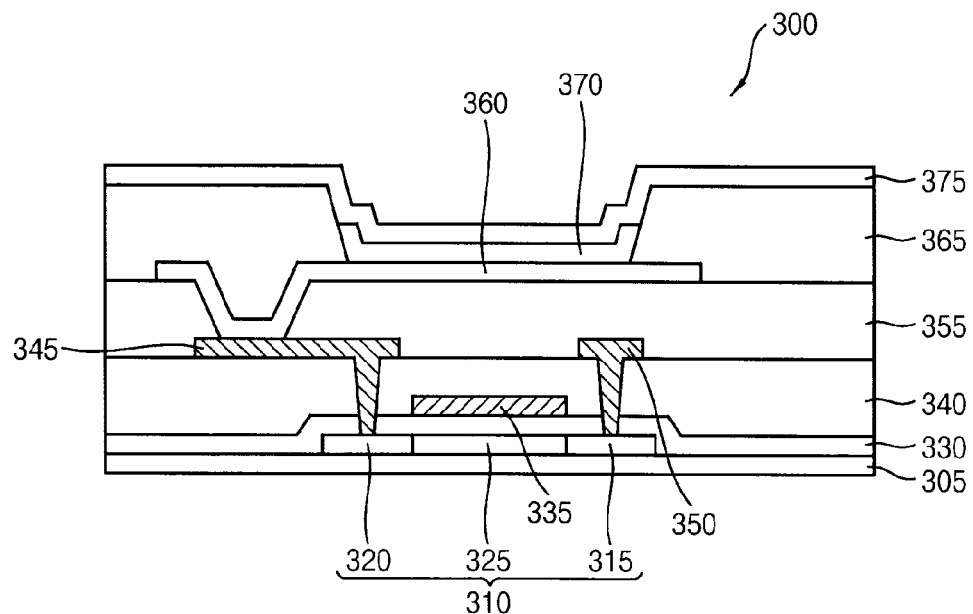
FIG. 9 is a cross-sectional view illustrating a seventh transistor included in the OLED display of FIG. 8.

FIG. 9 is a cross-sectional view illustrating a seventh transistor included in an OLED display of FIG. 8.

Referring to FIG. 9, the OLED display 300 includes a substrate 305, an active pattern 310, a gate insulation layer 330, a sixth gate electrode 335, a first insulation interlayer 340, a second connection pattern 345, a third connection pattern 350, a second insulation interlayer 355, a first electrode 360, a pixel defining layer 365, an organic light-emitting layer 370, and a second electrode 375.

The active pattern 310 is formed on the substrate 305 including an insulation material such as glass, transparent plastic, ceramic, etc. The active pattern 310 can be formed by a sputtering process, a CVD process, a printing process, a spray process, a vacuum deposition process, an ALD process, a sol-gel process, PECVD process, etc. The active pattern 310 includes a thirteenth region 315, a fourteenth region 320, and a channel region 325 located below the sixth gate electrode 335.

The gate insulation layer 330 is formed on the substrate 305 to cover the active pattern 310. The gate insulation layer 330 can be formed by a CVD process, a thermal oxidation process, a plasma enhanced chemical vapor deposition (PECVD) process, a high density plasma-chemical vapor deposition (HDP-CVD) process, etc. The gate insulation layer 330 can be relatively thick to sufficiently cover the active pattern 310.

The sixth gate electrode 335 is formed on the gate insulation layer 330. The sixth gate electrode 335 can be formed by a sputtering process, a CVD process, a printing process, a spray process, a vacuum deposition process, an ALD process, etc.

The active pattern 310 is doped with an impurity after the sixth gate electrode 335 is formed. The thirteenth region 315 and the fourteenth region 320 are doped with the impurity. On the other hand, the channel region 325 located below the sixth gate electrode 335 is not doped. As a result, the thirteenth region 315 and the fourteenth region 320 act as a conductor and the channel region 325 acts as a channel.

The first insulation interlayer 340 is formed on the gate insulation layer 330. The first insulation interlayer 340 can be a relatively thick to sufficiently cover the sixth gate electrode 335. In this embodiment, the first insulation interlayer 340 has a substantially flat upper surface. In one example embodiment, a planarization process is performed on the first insulation interlayer 340 to enhance the flatness of the first insulation interlayer 340.

The first insulation interlayer 340 is partially etched to form a fifth contact hole and a sixth contact hole partially exposing the fourteenth region 320 and the thirteenth region 315 of the active pattern 310. The second connection pattern 345 and the third connection pattern 350 are formed on the first insulation interlayer 340 by filling the fifth contact hole and the sixth contact hole.

The second insulation interlayer 355 is formed on the first insulation interlayer 340 to cover the second connection pattern 345 and the third connection pattern 350. The second insulation interlayer 355 can be relatively thick to sufficiently cover the second connection pattern 345 and the third connection pattern 350. In this embodiment, the second insulation interlayer 355 has a substantially flat upper surface. In one example embodiment, a planarization process is performed on the first insulation interlayer 340 to enhance the flatness of the first insulation interlayer 340.

The second insulation interlayer 355 is partially etched to form a eighth contact hole partially exposing a portion of the second connection pattern 345. The first electrode 360 is formed on the second insulation interlayer 355 by filling the eighth contact hole.

The pixel defining layer 365 is formed on the second insulation interlayer 355 to cover the first electrode 360. The pixel defining layer 365 can be a relatively thick to sufficiently cover the first electrode 360.

The pixel defining layer 365 is partially etched to form an opening that exposes the first electrode 360. The organic light-emitting layer 370 is formed in the opening. The organic light-emitting layer 370 is formed on the first electrode 360 exposed by the opening.

The second electrode 375 is formed on the pixel defining layer 365 and organic light-emitting layer 370.

Figure 10:
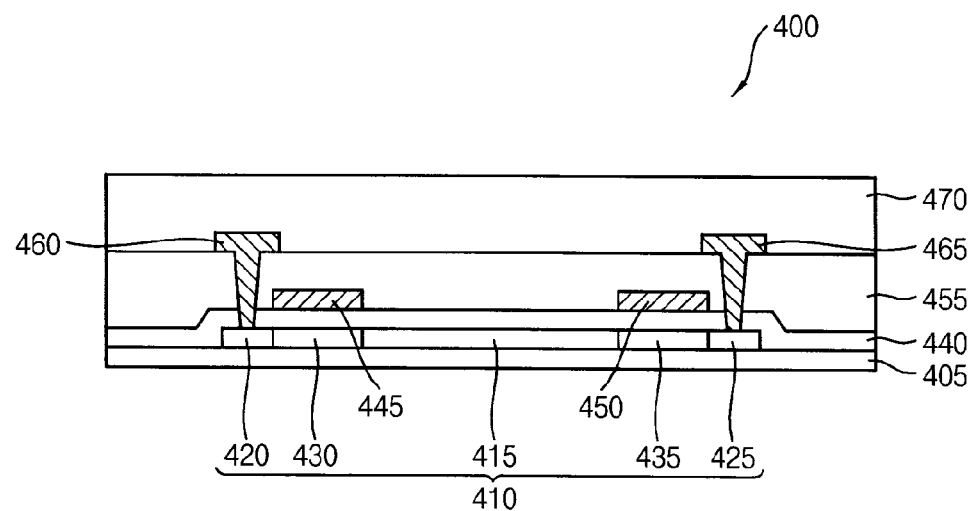
FIG. 10 is a cross-sectional view illustrating third and sixth transistors included in an OLED display of FIG. 8.

FIG. 10 is a cross-sectional view illustrating third and sixth transistors included in an OLED display of FIG. 8.

Referring to FIG. 10, the OLED display 400 includes a substrate 405, an active pattern 410, a gate insulation layer 440, a third gate electrode 445, a fifth gate electrode 450, a first insulation interlayer 455, a first connection pattern 460, a second connection pattern 465, a second insulation interlayer 470.

The substrate 405 includes an insulation material. The active pattern 410 is formed on the substrate 405. The active pattern 410 includes the fifth and eleventh regions 415, the sixth region 420, the twelfth region 425, the first channel region 430 located below the third gate electrode 445, and the second channel region 435 located below the fifth gate electrode 450.

The gate insulation layer 440 is formed on the substrate 405 to cover the active pattern 410. The third gate electrode 445 and fifth gate electrode 450 are formed on the gate insulation layer 440.

The active pattern 410 is doped with the impurity after the third gate electrode 445 and fifth gate electrode 450 are formed. The fifth and eleventh regions 415, the sixth region 420, and the twelfth region 425 are doped with the impurity. On the other hand, the first channel region 430 and the second channel region 435 are not doped. As a result, the fifth and eleventh regions 415, the sixth region 420, and the twelfth region 425 act as a conductor. The first channel region 430 acts as the channel of the third transistor TR3 and the second channel region 435 acts as the channel of the sixth transistor TR6.

The first insulation interlayer 455 is formed on the gate insulation layer 440 to cover the third gate electrode 445 and fifth gate electrode 450. The first connection pattern 460 and the second connection pattern 465 are formed on the first insulation interlayer 455. The first connection pattern 460 contacts the sixth region 420 through a fourth contact hole. The second connection pattern 465 contacts the twelfth region 425 through a fifth contact hole. The second insulation interlayer 470 is formed on the first insulation interlayer 455 to cover the first connection pattern 460 and the second connection pattern 465.

Figure 11:
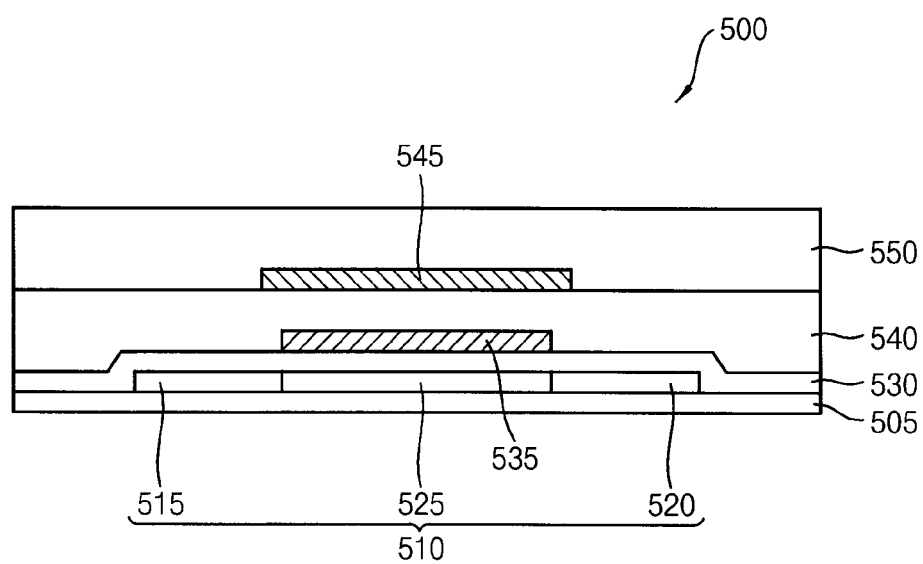
FIG. 11 is a cross-sectional view illustrating a first transistor included in an OLED display of FIG. 8.

FIG. 11 is a cross-sectional view illustrating a first transistor included in an OLED display of FIG. 8.

Referring to FIG. 11, the OLED display 500 includes a substrate 505, an active pattern 510, a gate insulation layer 530, a first gate electrode 535, a first insulation interlayer 540, a power pattern 545, and a second insulation interlayer 550.

The substrate 505 includes an insulation material. The active pattern 510 is formed on the substrate 505. The active pattern 510 includes the first region 515, the second region 520, and the channel region 525 located below the first gate electrode 535.

The gate insulation layer 530 is formed on the substrate 505 to cover the active pattern 510. The first gate electrode 535 is formed on the gate insulation layer 530.

The active pattern 510 is doped with the impurity after the first gate electrode 535 is formed. The first region 515 and the second region 520 are doped with the impurity. On the other hand, the channel region 525 located below the first gate electrode 535 is not doped. As a result, the first region 515 and the second region 520 act as a conductor. The channel region 525 located below the first gate electrode 535 act as the channel of the first transistor TR1.

The first insulation interlayer 540 is formed on the gate insulation layer 530 to cover the first gate electrode 535. The power pattern 545 is formed on the first insulation interlayer 540. The second insulation interlayer 550 is formed on the first insulation interlayer 540 to cover the power pattern 545.

The described technology can be applied to an electronic device having the OLED display. For example, the described technology can be applied to a cellular phone, a smart phone, a smart pad, a personal digital assistant (PDA), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive technology. Accordingly, all such modifications are intended to be included within the scope of the invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pixel comprising:
   an organic light-emitting diode (OLED) configured to emit light based on a driving current, wherein the OLED includes a first electrode and a second electrode;
   a first transistor configured to generate the driving current, wherein the first transistor includes a gate electrode, a first electrode, and a second electrode; and
   a capacitor transistor including i) a gate electrode configured to receive a gate turn-on voltage, ii) a first electrode, and iii) a second electrode electrically connected to the first electrode of the first transistor,
   wherein the capacitor transistor further includes a channel located between the first electrode of the capacitor transistor and the second electrode of the capacitor transistor, and
   wherein the channel of the capacitor transistor is configured to be activated by the gate turn-on voltage.

2. The pixel of claim 1, wherein the capacitor transistor is further configured to act as a capacitor when activated, wherein the activated channel is configured to act as a first electrode of the capacitor and wherein the gate electrode of the capacitor transistor is configured to act as a second electrode of the capacitor.

3. The pixel of claim 1, further comprising:
   a second transistor including i) a gate electrode configured to receive a scan signal, ii) a first electrode configured to receive a data signal, and iii) a second electrode electrically connected to the first electrode of the capacitor transistor;
   a third transistor including i) a gate electrode configured to receive the scan signal, ii) a first electrode electrically connected to the second electrode of the first transistor, and iii) a second electrode electrically connected to the gate electrode of the first transistor;
   a storage capacitor including i) a first electrode configured to receive a first power voltage and ii) a second electrode electrically connected to the gate electrode of the first transistor;
   a fourth transistor including i) a gate electrode configured to receive a data initialization signal, ii) a first electrode configured to receive an initialization voltage, and iii) a second electrode electrically connected to the gate electrode of the first transistor;
   a fifth transistor including i) a gate electrode configured to receive an emission signal, ii) a first electrode configured to receive the first power voltage, and iii) a second electrode electrically connected to the first electrode of the first transistor;
   a sixth transistor including i) a gate electrode configured to receive the emission signal, ii) a first electrode electrically connected to the second electrode of the first transistor, and iii) a second electrode electrically connected the first electrode of the OLED; and
   a seventh transistor including i) a gate electrode configured to receive a diode initialization signal, ii) a first electrode configured to receive the initialization voltage, and iii) a second electrode electrically connected to the first electrode of the OLED,
   wherein the second electrode of the OLED is configured to receive a second power voltage.

4. The pixel of claim 3, wherein the second transistor is configured to apply the data signal to the first electrode of the capacitor transistor when the scan signal is active,
   wherein the third transistor is configured to electrically connect the gate electrode of the first transistor to the second electrode of the first transistor when the scan signal is active,
   wherein the storage capacitor is configured to maintain a voltage level of the gate electrode of the first transistor when the scan signal is inactive,
   wherein the fourth transistor is configured to apply the initialization voltage to the gate electrode of the first transistor when the data initialization signal is active,
   wherein the fifth transistor is configured to apply the first power voltage to the first electrode of the first transistor when the emission signal is active,
   wherein the sixth transistor is configured to provide the driving current generated by the first transistor to the OLED when the emission signal is active,
   wherein the seventh transistor is configured to apply the initialization voltage to the first electrode of the OLED when the diode initialization signal is active, and
   wherein the OLED is configured to emit light when the emission signal is active.

5. The pixel of claim 3, wherein the data initialization signal and the diode initialization signal are the same.

6. The pixel of claim 3, wherein the data initialization signal is the same as a scan signal applied to an adjacent pixel in a previous pixel row.

7. The pixel of claim 1, further comprising a response speed improvement capacitor electrically connected between the gate electrode of the first transistor and the first electrode of the first transistor.

8. The pixel of claim 1, further comprising a diode parallel capacitor electrically connected between the first electrode of the OLED and the second electrode of the OLED.

9. An organic light-emitting diode (OLED) display, comprising:
a substrate;
an active pattern formed on the substrate, wherein the active pattern includes a first region, a second region, a first capacitor region, a second capacitor region, and a channel region located between the first and second capacitor regions;
a gate insulation layer covering the active pattern, wherein the gate insulation layer is formed on the substrate;
a first gate electrode formed on the gate insulation layer, wherein the first gate electrode, the first region, and the second region form a first transistor;
a second gate electrode configured to receive a gate turn-on voltage, wherein the second gate electrode is formed on the gate insulation layer and wherein the second gate electrode, the first capacitor region, the second capacitor region, and the channel region form a capacitor transistor; and
an OLED formed on the substrate,
wherein the first transistor is configured to i) generate a driving current and ii) provide the driving current to the OLED,
wherein the second capacitor region is electrically connected to the first region, and
wherein the channel is configured to be activated by the gate turn-on voltage.

10. The display of claim 9, wherein the capacitor transistor is further configured to act as a capacitor when activated, wherein the activated channel is configured to act as a first electrode and wherein the gate electrode of the capacitor transistor is configured to act as a second electrode of the capacitor.

11. The display of claim 9, wherein the active pattern further includes third through fourteenth regions.

12. The display of claim 11, further comprising:
a third gate electrode formed on the gate insulation layer, wherein the third gate electrode, the third region, and the fourth region form a second transistor and wherein the third gate electrode, the fifth region, and the sixth region form a third transistor;
a fourth gate electrode formed on the gate insulation layer, wherein the fourth gate electrode, the seventh region, and the eighth region form a fourth transistor;
a fifth gate electrode formed on the gate insulation layer, wherein the fifth gate electrode, the ninth region, and the tenth region form a fifth transistor and wherein the fifth gate electrode, the eleventh region, and the twelfth region form a sixth transistor; and
a sixth gate electrode formed on the gate insulation layer, wherein the sixth gate electrode, the thirteenth region, and the fourteenth region form a seventh transistor.

13. The display of claim 12, wherein the fourth region is electrically connected to the first capacitor region,
wherein the fifth region is electrically connected to the second region,
wherein the eighth region is electrically connected to the sixth region,
wherein the tenth region is electrically connected to the first region,
wherein the eleventh region is electrically connected to the second region, and
wherein the fourteenth region is electrically connected to the twelfth region.

14. The display of claim 13, wherein the third gate electrode is configured to receive a scan signal,
wherein the fourth gate electrode is configured to receive a data initialization signal,
wherein the fifth gate electrode is configured to receive an emission signal,
wherein the sixth gate electrode is configured to receive a diode initialization signal, and
wherein the seventh region and the thirteenth region are configured to receive an initialization voltage.

15. The display of claim 13, further comprising:
a first insulation interlayer covering the first through sixth gate electrodes, wherein the first insulation interlayer is formed on the gate insulation layer;
a data pattern formed on the first insulation interlayer, wherein the data pattern contacts the third region;
a power pattern formed on the first insulation interlayer, wherein the power pattern and the first gate electrode form a storage capacitor and wherein the power pattern contacts the ninth region;
a first connection pattern formed on the first insulation interlayer, wherein the first connection pattern contacts the first gate electrode and the eighth region; and
a second connection pattern formed on the first insulation interlayer, wherein the second connection pattern contacts the twelfth region.

16. The display of claim 15, wherein the data pattern is configured to receive a data signal and wherein the power pattern is configured to receive a first power voltage.

17. The display of claim 15, further comprising:
a second insulation interlayer covering the data pattern, the power pattern, the first connection pattern, and the second connection pattern, wherein the second insulation interlayer is formed on the first insulation interlayer; and
a first electrode formed on the second insulation interlayer, wherein the first electrode contacts the second connection pattern.

18. The display of claim 17, further comprising:
a pixel defining layer formed on the second insulation interlayer;
an organic light-emitting layer formed on the first electrode; and
a second electrode formed on the second insulation interlayer and the organic light-emitting layer.

19. The display of claim 18, wherein the second electrode is configured to receive a second power voltage.

20. The display of claim 18, wherein the first electrode, the organic light-emitting layer, and the second electrode form the OLED.

* * * * *